(12) United States Patent
Shiba et al.

(10) Patent No.: US 9,276,213 B2
(45) Date of Patent: Mar. 1, 2016

(54) PHOTOELECTRIC CONVERSION MATERIAL, METHOD FOR PRODUCING THE SAME, AND ORGANIC PHOTOVOLTAIC CELL CONTAINING THE SAME

(71) Applicant: HONDA MOTOR CO., LTD., Tokyo (JP)

(72) Inventors: Tadahiro Shiba, Wako (JP); Kazuhiro Miura, Wako (JP)

(73) Assignee: Honda Motor Co., Ltd., Tokyo (JP)

( * ) Notice: Subject to any disclaimer, the term of this patent is extended or adjusted under 35 U.S.C. 154(b) by 375 days.

(21) Appl. No.: 13/778,661

(22) Filed: Feb. 27, 2013

(65) Prior Publication Data

US 2013/0228223 A1   Sep. 5, 2013

(30) Foreign Application Priority Data

| Mar. 5, 2012 | (JP) | 2012-048591 |
| Mar. 5, 2012 | (JP) | 2012-048594 |
| Dec. 20, 2012 | (JP) | 2012-278161 |
| Dec. 20, 2012 | (JP) | 2012-278172 |

(51) Int. Cl.
*H01L 51/00* (2006.01)
*C08G 61/10* (2006.01)
*H01L 51/42* (2006.01)

(52) U.S. Cl.
CPC ............ *H01L 51/0035* (2013.01); *C08G 61/10* (2013.01); *H01L 51/42* (2013.01); *C08G2261/148* (2013.01); *C08G 2261/312* (2013.01); *C08G 2261/43* (2013.01); *C08G 2261/72* (2013.01); *C08G 2261/91* (2013.01); *H01L 51/4253* (2013.01); *Y02E 10/549* (2013.01)

(58) Field of Classification Search
CPC .................................................. C01B 31/0438
See application file for complete search history.

(56) References Cited

U.S. PATENT DOCUMENTS

| 8,012,530 | B2 | 9/2011 | Yoshikawa et al. | |
| 8,124,966 | B2 | 2/2012 | Lazarev | |
| 8,222,074 | B2 | 7/2012 | Lazarev | |
| 2013/0228222 | A1* | 9/2013 | Shiba | H01L 51/0035 136/263 |
| 2014/0212668 | A1* | 7/2014 | Dichtel | H01L 31/1884 428/402 |
| 2015/0034880 | A1* | 2/2015 | Miura | H01L 51/0035 252/500 |
| 2015/0038666 | A1* | 2/2015 | Miyazaki | H01L 51/0038 528/125 |
| 2015/0059854 | A1* | 3/2015 | Shiba | H01L 51/0035 136/263 |

FOREIGN PATENT DOCUMENTS

| JP | 2007-019086 A | 1/2007 |
| JP | 2007-273939 A | 10/2007 |
| JP | 4005571 B2 | 11/2007 |
| JP | 2009-231810 A | 10/2009 |
| JP | 2010-056492 A | 3/2010 |
| JP | 2010-508667 A | 3/2010 |
| JP | 2010-508677 A | 3/2010 |
| WO | 2008-056126 A1 | 5/2008 |
| WO | 2008/056126 A1 | 5/2008 |

OTHER PUBLICATIONS

Kuilla et al. Recent advances in graphene based polymer composites. Progress in POlymer Science 2010, vol. 35, pp. 1350-1375.*
Dias, Jerry Ray. A Theoretical Study of C60 Benzoids. Journal of Molecular Structure (Theochem) 1989, vol. 185, pp. 57-81.*
J. Wu et al., "From branched polyphenylenes to graphite ribbons", Macromolecules 36, 7082-7089 (2003).*
Office Action from the Japan Patent Office dated Dec. 1, 2015, issued in counterpart Japanese Patent Application No. 2012-278168 (3 pages).

(56) References Cited

OTHER PUBLICATIONS

Partial English Translation of Office Action from the Japan Patent Office dated Dec. 1, 2015, issued in counterpart Japanese Patent Application No. 2012-278168 (1 page).

Office Action from the Japan Patent Office dated Dec. 1, 2015, issued in counterpart Japanese Patent Application No. 2012-278157 (4 pages).

Partial English Translation of Office Action from the Japan Patent Office dated Dec. 1, 2015, issued in counterpart Japanese Patent Application No. 2012-278157 (1 page).

Wu, J., et al., "From Branched Polyphenylenses to Graphite Ribbons," Macromolecules, Aug. 19, 2003, vol. 36, pp. 7082-7089, American Chemical Society.

* cited by examiner

*Primary Examiner* — Jeffrey T Barton

*Assistant Examiner* — Meisha Binkley

(74) *Attorney, Agent, or Firm* — Capitol City TechLaw, PLLC; Samuel P. Burkholder

(57) ABSTRACT

A photoelectric conversion material, which acts as an electron donor for donating an electron or an electron acceptor for accepting an electron, contains a polymer having at least one structural unit selected from graphenes represented by the following general formulae (1) to (4):

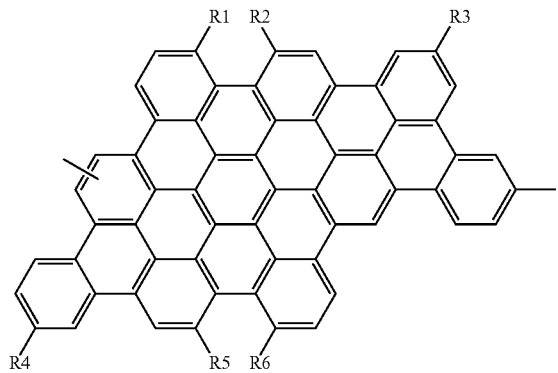

-continued

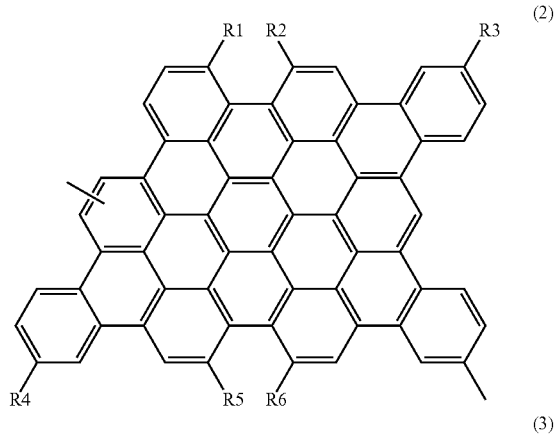

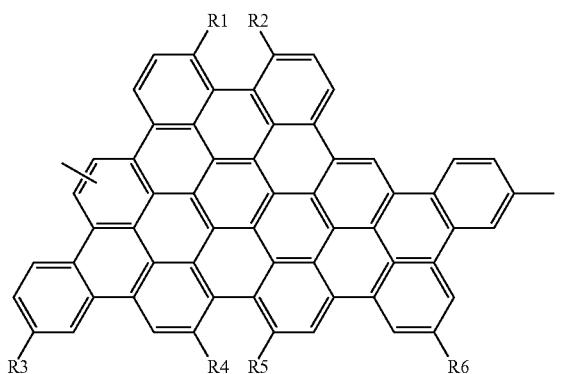

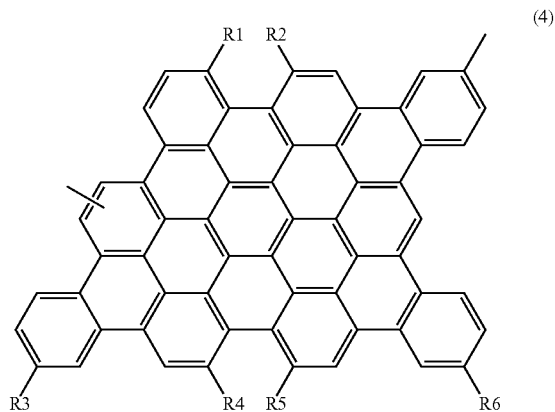

wherein at least one of R1 to R6 in each of the general formulae (1) to (4) is a solubilizing group, and the polymer exhibits a higher solubility in an organic solvent with the solubilizing group than without the solubilizing group.

18 Claims, 12 Drawing Sheets

FIG. 9

| PROPERTY | EVALUATION | NANOGRAPHENE POLYMER | P3HT |
|---|---|---|---|
| Eg | ULTRAVIOLET-VISIBLE ABSORPTION SPECTROSCOPY (UV-Vis) | 2.0eV | 2.2eV |
| HOMO | PHOTOELECTRON YIELD SPECTROSCOPY (PYS) | -5.5eV | -4.7eV |

PHOTOELECTRIC CONVERSION MATERIAL, METHOD FOR PRODUCING THE SAME, AND ORGANIC PHOTOVOLTAIC CELL CONTAINING THE SAME

CROSS-REFERENCE TO RELATED APPLICATIONS

This application is based upon and claims the benefit of priority from Japanese Patent Applications No. 2012-048591 filed on Mar. 5, 2012, No. 2012-048594 filed on Mar. 5, 2012, No. 2012-278161 filed on Dec. 20, 2012 and No. 2012-278172 filed on Dec. 20, 2012, the contents all of which are incorporated herein by reference.

BACKGROUND OF THE INVENTION

1. Field of the Invention

The present invention relates to a photoelectric conversion material containing a polymer having a condensed aromatic ring structural unit with a side-chain solubilizing group, a method for producing the photoelectric conversion material, and an organic photovoltaic cell using the photoelectric conversion material.

2. Description of the Related Art

Organic photovoltaic cells using organic materials, which can be easily produced by a low-cost process such as a roll-to-roll process, have attracted much attention. Such organic photovoltaic cells include bulk heterojunction-type organic photovoltaic cells (hereinafter referred to also as BHJ solar cells).

The BHJ solar cell has a photoelectric conversion layer for converting a light into electricity, and the photoelectric conversion layer contains a mixture of a donor domain and an acceptor domain. The donor domain contains a photoelectric conversion material that acts as an electron donor, and the acceptor domain contains a photoelectric conversion material that acts as an electron acceptor. Specifically, the photoelectric conversion layer is interposed between positive and negative electrodes. When sunlight is introduced through the positive electrode into the photoelectric conversion layer, an exciton is generated in the layer.

The exciton reaches an interface between the donor and acceptor domains, and then is divided into an electron and a hole. The electron is transferred through the acceptor domain to the negative electrode, while the hole is transferred through the donor domain to the positive electrode. The hole and the electron are utilized to generate an electrical energy for biasing an external circuit electrically connected to the negative and positive electrodes.

As described in Japanese Laid-Open Patent Publication No. 2007-273939, typical examples of the photoelectric conversion materials (i.e. the donor and the acceptor) used in the photoelectric conversion layer having the above function include poly(3-hexylthiophene) (P3HT, see FIG. 10) and phenyl-$C_{61}$-butyric acid methyl ester (PCBM, see FIG. 11) respectively.

P3HT and PCBM have energy levels of highest occupied molecular orbital (HOMO) and lowest unoccupied molecular orbital (LUMO) shown in FIG. 12. When the light is introduced into the photoelectric conversion layer as described above, an electron is transferred from the HOMO to the LUMO in the donor P3HT. Thus, the energy level difference between the HOMO and the LUMO of P3HT corresponds to the bandgap (Eg).

Then, the electron in the LUMO of P3HT is transferred to the LUMO of the acceptor PCBM, whereby the electron and the hole are generated. Thus, the energy level difference between the LUMO of P3HT and the LUMO of PCBM results in an energy loss, and the energy level difference between the HOMO of P3HT and the LUMO of PCBM corresponds to the open circuit voltage (Voc).

As the photoelectric power conversion efficiency of the solar cell becomes higher, the area required for achieving a desired power generation capacity is reduced. Therefore, advantageously, the solar cell can have a lighter weight and a smaller installation area, so that the layout of the solar cell can be freely designed.

The photoelectric power conversion efficiency of the organic photovoltaic cells such as the BHJ solar cell can be increased by (a) improving the absorption of a light to accelerate the exciton generation, (b) improving the absorption of a long-wavelength (near-infrared) light to increase the sunlight utilization efficiency, (c) increasing the open circuit voltage Voc, or the like. In view of achieving the procedures of (a) to (c), a donor having (A) a high absorbance coefficient, (B) a small energy level difference between the HOMO and LUMO (a narrow bandgap Eg), and (C) a LUMO energy level close to that of the acceptor may be selected.

Condensed aromatic ring compounds (i.e. π-electron conjugated compounds) described in Japanese Patent No. 4005571 and Japanese Laid-Open Patent Publication Nos. 2010-056492, 2007-019086, and 2010-508677 (PCT) may have the above properties of (A) to (C). Such condensed aromatic ring compounds are sometimes referred to as graphenes (see Japanese Laid-Open Patent Publication No. 2007-019086).

SUMMARY OF THE INVENTION

In a technology described in Japanese Patent No. 4005571, a functional group is bonded to hexabenzocoronene (HBC), and the resultant molecules are self-assembled utilizing the functional group to obtain a so-called nanotube-like aggregate. Thus, a large number of processes are required to obtain the final semiconductor product. In addition, it is unclear whether the obtained aggregate is a p-type (donor) or an n-type (acceptor).

In Japanese Laid-Open Patent Publication No. 2010-056492, it is suggested that a nanotube composed of an HBC aggregate has both of a hole-conducting path and an electron-conducting path. In a technology described in Japanese Laid-Open Patent Publication No. 2010-056492, the inner and outer surfaces of the nanotube are covered with a fullerene, and the coverage is selected to control the hole mobility in HBC. It is clear from this that the electron-donating property of HBC per se cannot be improved in the technologies of Japanese Patent No. 4005571 and Japanese Laid-Open Patent Publication No. 2010-056492.

In a technology described in Japanese Laid-Open Patent Publication No. 2007-019086, a functional group having a fluorine atom is bonded to a graphene derivative to obtain an n-type semiconductor. Thus, in this technology, a donor cannot be produced though the acceptor is obtained.

All of Japanese Patent No. 4005571 and Japanese Laid-Open Patent Publication Nos. 2010-056492, 2007-019086, and 2010-508677 (PCT) disclose only organic low-molecular compounds. As is well known, such organic low-molecular compounds are poorly soluble in a solvent. Therefore, disadvantageously, it is difficult to form the photoelectric conversion layer containing the compound by using the roll-to-roll process or the like.

A principal object of the present invention is to provide a photoelectric conversion material, which has an excellent property as an electron donor or acceptor and is readily soluble in an organic solvent.

Another object of the invention is to provide a photoelectric conversion material, from which a photoelectric conversion layer can be formed simply with ease.

A further object of the invention is to provide a method for producing the photoelectric conversion material.

A still further object of the invention is to provide an organic photovoltaic cell having the photoelectric conversion layer containing the photoelectric conversion material.

According to an aspect of the invention, there is provided a photoelectric conversion material that acts as an electron donor for donating an electron or an electron acceptor for accepting an electron. The photoelectric conversion material contains a polymer having at least one structural unit selected from graphenes represented by the following general formulae (1) to (4).

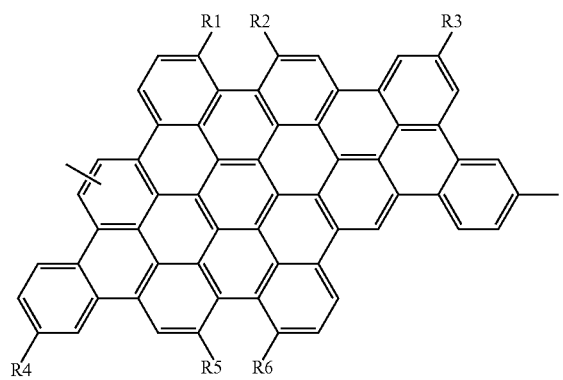

(1)

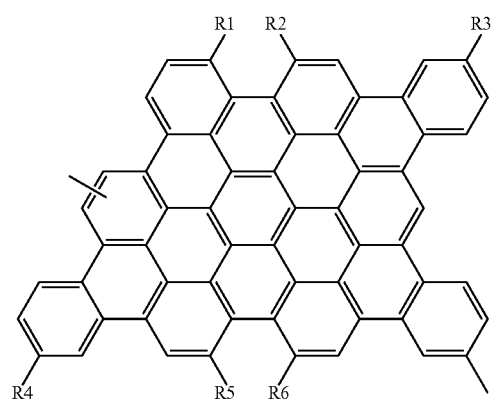

(2)

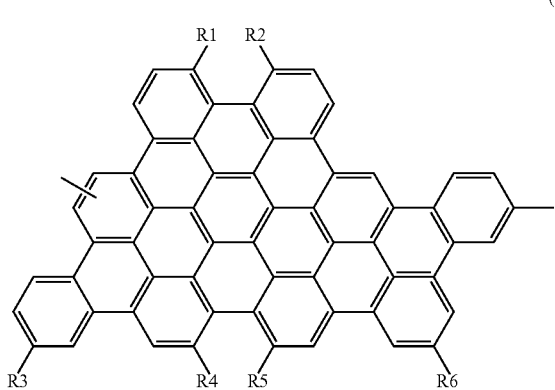

(3)

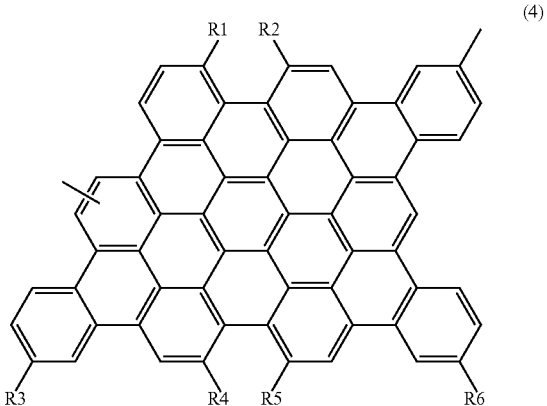

(4)

In each of the general formulae (1) to (4), at least one of R1 to R6 is a solubilizing group, and the polymer exhibits a higher solubility in an organic solvent with the solubilizing group than without the solubilizing group.

The photoelectric conversion material of the invention contains the π-conjugated polymer having the condensed aromatic ring structural unit. A π-electron cloud is spread over the π-conjugated polymer. The π-conjugated polymer is hereinafter referred to also as the nanographene polymer. This polymer can have a high absorbance coefficient and actively generate an exciton because the π-electron cloud spreads along the main chain.

In particular, the polymer exhibits a small energy level difference between the HOMO and the LUMO, and thus has a narrow bandgap Eg. Therefore, the polymer has a maximum absorption wavelength shifted to the long-wavelength side, and thereby can excellently absorb a long-wavelength (near-infrared) light. Consequently, the polymer exhibits an improved sunlight utilization efficiency.

Furthermore, the polymer has a LUMO energy level lower (deeper) than those of P3HT and the like. Therefore, a photoelectric conversion layer using the polymer as a donor in combination with the acceptor PCBM exhibits an energy loss lower than that of a layer using the donor P3HT. Consequently, organic photovoltaic cells using the polymer exhibit a high open circuit voltage Voc.

For the above reasons, the organic photovoltaic cells containing the polymer as the donor have an improved power conversion efficiency.

In addition, the polymer is readily soluble in the organic solvent since the solubilizing groups are introduced thereto. Therefore, the polymer can be significantly readily dissolved in the solvent. Thus, a photoelectric conversion layer can be formed from the polymer simply with ease by using a spin coating process, a roll-to-roll process, or the like.

Incidentally, in the present invention, the condensed aromatic rings represented by the general formulae (1) to (4) are referred to as graphenes as in Japanese Laid-Open Patent Publication No. 2007-019086. Nanometer-scale graphene structural units are referred to as nanographenes.

For example, the polymer may be a reaction product derived from a polyphenylene represented by the following general formula (5).

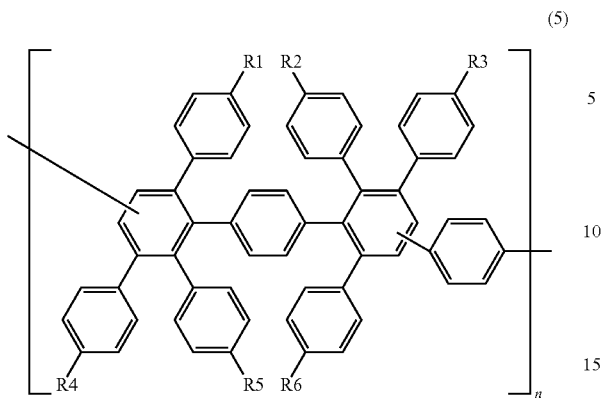

(5)

R1 to R6 in the general formula (5) have the same meanings as those in the general formulae (1) to (4).

In a reaction of the polyphenylene represented by the general formula (5), the solubilizing groups in a plurality of the structural units act as steric hindrances for preventing the structural units from coming close to each other. Therefore, the structural units in the polyphenylene can be sufficiently reacted while preventing the cross-linking of the structural units. Consequently, the π-conjugated polymer having the condensed aromatic ring structural units, which the π-electron cloud is sufficiently spread over, can be easily produced by the reaction. The solubilizing groups can be introduced into the polymer in this manner.

In the general formulae (1) to (4), it is preferred that all of R1 to R6 are the solubilizing groups. The solubilizing group is preferably an alkyl group, more preferably a $C_3$-$C_{20}$ alkyl group.

When all of R1 to R6 are alkyl groups, the polymer has a further improved affinity for the organic solvent, and therefore exhibits a further improved solubility in the organic solvent.

When the carbon number of the alkyl group is not within the range of 3 to 20, it is not easy to sufficiently increase the solubility of the polymer in the organic solvent.

In other words, when the carbon number of the alkyl group is within the above range, the polymer is readily soluble in the solvent.

The polymer preferably has a polymerization degree (the number of the structural units) of 10 to 150. When the polymerization degree is less than 10, it is not easy to sufficiently increase the absorbance coefficient or to sufficiently narrower the Eg. On the other hand, when the polymerization degree is more than 150, it takes a long time to perform the polymerization, resulting in a low polymer production efficiency.

In other words, when the polymerization degree is within the above range, the polymer can be efficiently produced with an excellent donor property.

In the case of using the above graphene as the structural unit, the polymer preferably has a molecular weight of 9,900 to 364,000.

According to another aspect of the invention, there is provided a method for producing a photoelectric conversion material that acts as an electron donor for donating an electron or an electron acceptor for accepting an electron. The method contains polymerizing a phenylene derivative to prepare a polyphenylene represented by the following general formula (5) and reacting the polyphenylene to prepare a polymer having at least one structural unit selected from graphenes represented by the following general formulae (1) to (4).

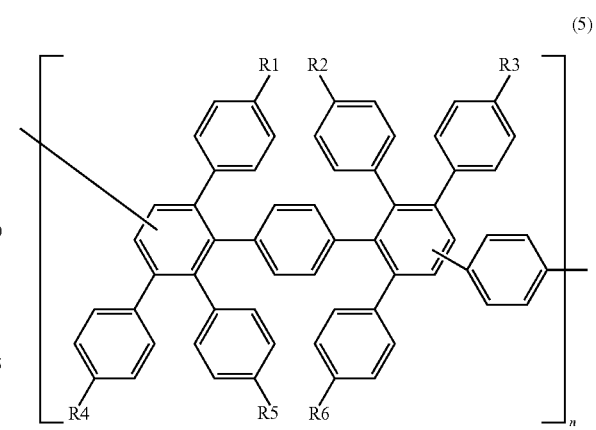

(5)

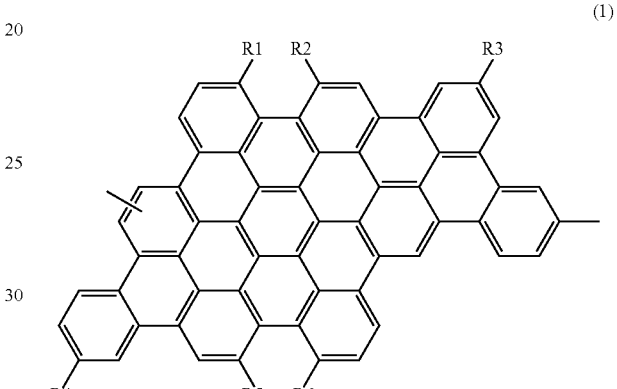

(1)

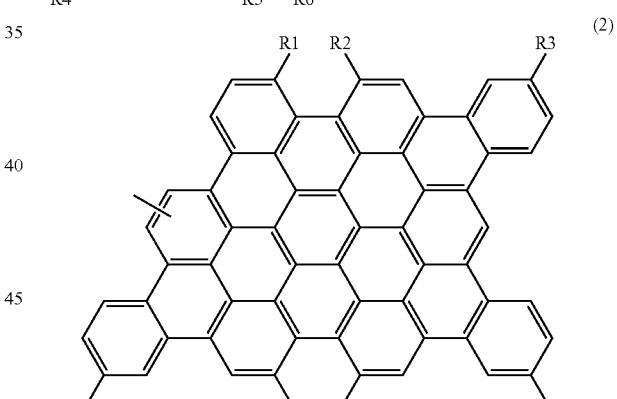

(2)

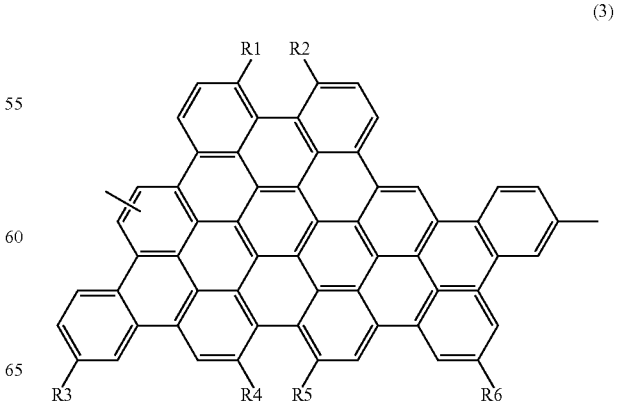

(3)

-continued

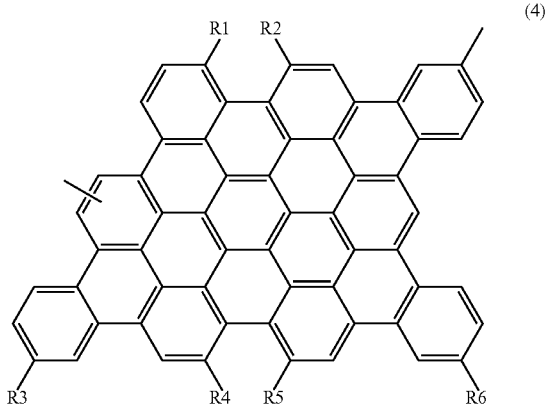

(4)

R1 to R6 in the general formulae (1) to (5) have the same meanings as above.

The method is capable of readily producing the polymer with a uniform structure as the photoelectric conversion material (the donor or the acceptor). Thus, in the invention, the polymer having the graphene structural unit containing the solubilizing group can be produced by the steps of polymerizing a phenylene derivative, introducing the solubilizing group into the resultant unsubstituted polyphenylene, and subjecting the polyphenylene to a further reaction.

In the general formulae (1) to (5), it is preferred that all of R1 to R6 are the solubilizing groups. The solubilizing group is preferably an alkyl group, more preferably a $C_3$-$C_{20}$ alkyl group. In this case, as described above, the polymer, which has the excellent donor property and is readily soluble in the solvent, can be efficiently produced.

In the polymerization, it is preferred that the polymerization degree of the polymer is controlled within a range of 10 to 150 for the above reasons. For example, the polymerization degree of 10 to 150 can be achieved by appropriately selecting the reaction temperature, the reaction time, or another condition in the polymerization.

According to a further aspect of the invention, there is provided an organic photovoltaic cell using the above-described photoelectric conversion material containing the polymer. The organic photovoltaic cell has a photoelectric conversion layer containing the photoelectric conversion material as the electron donor.

In the organic photovoltaic cell using the donor of the photoelectric conversion material in combination with the acceptor PCBM, the photoelectric conversion layer exhibits a higher absorbance coefficient, and the donor exhibits a smaller energy level difference between the HOMO and LUMO (a narrower bandgap Eg), as compared with a cell using P3HT. Furthermore, the donor has a LUMO energy level close to that of the acceptor PCBM.

Therefore, the organic photovoltaic cell exhibits an active exciton generation property, an improved sunlight utilization efficiency, and a high open circuit voltage Voc. For these reasons, the organic photovoltaic cell has an improved power conversion efficiency.

Since the organic photovoltaic cell has a high power conversion efficiency, only a small area is required for achieving a desired power generation capacity. Therefore, the organic photovoltaic cell can have a light weight and a small load on its installation site. Furthermore, the organic photovoltaic cell can be placed in a small site, so that the layout of the photovoltaic cell can be freely designed.

The photoelectric conversion layer can be formed simply with ease using a solution of the polymer in the solvent. Therefore, the organic photovoltaic cell can be produced simply with ease.

For example, the organic photovoltaic cell is preferably a bulk heterojunction-type solar cell having a photoelectric conversion layer containing a mixture of a donor domain and an acceptor domain. The bulk heterojunction-type solar cell has a larger contact area between the donor and acceptor domains, as compared with a planar heterojunction-type solar cell having a donor layer and an acceptor layer separated from each other. In the organic photovoltaic cell, the exciton is divided into the electron and hole for power generation mainly on the interface between the donor and acceptor domains. Therefore, the bulk heterojunction-type solar cell exhibits a higher power conversion efficiency due to the larger contact area.

The above and other objects, features, and advantages of the present invention will become more apparent from the following description when taken in conjunction with the accompanying drawings in which a preferred embodiment of the present invention is shown by way of illustrative example.

BRIEF DESCRIPTION OF THE DRAWINGS

FIG. 9 is a table including properties of the photoelectric conversion material and P3HT;

DESCRIPTION OF THE PREFERRED EMBODIMENTS

A preferred embodiment of the photoelectric conversion material and the production method of the present invention will be described in detail below using a BHJ solar cell having a photoelectric conversion layer containing the material with reference to the accompanying drawings.

Figure 1:
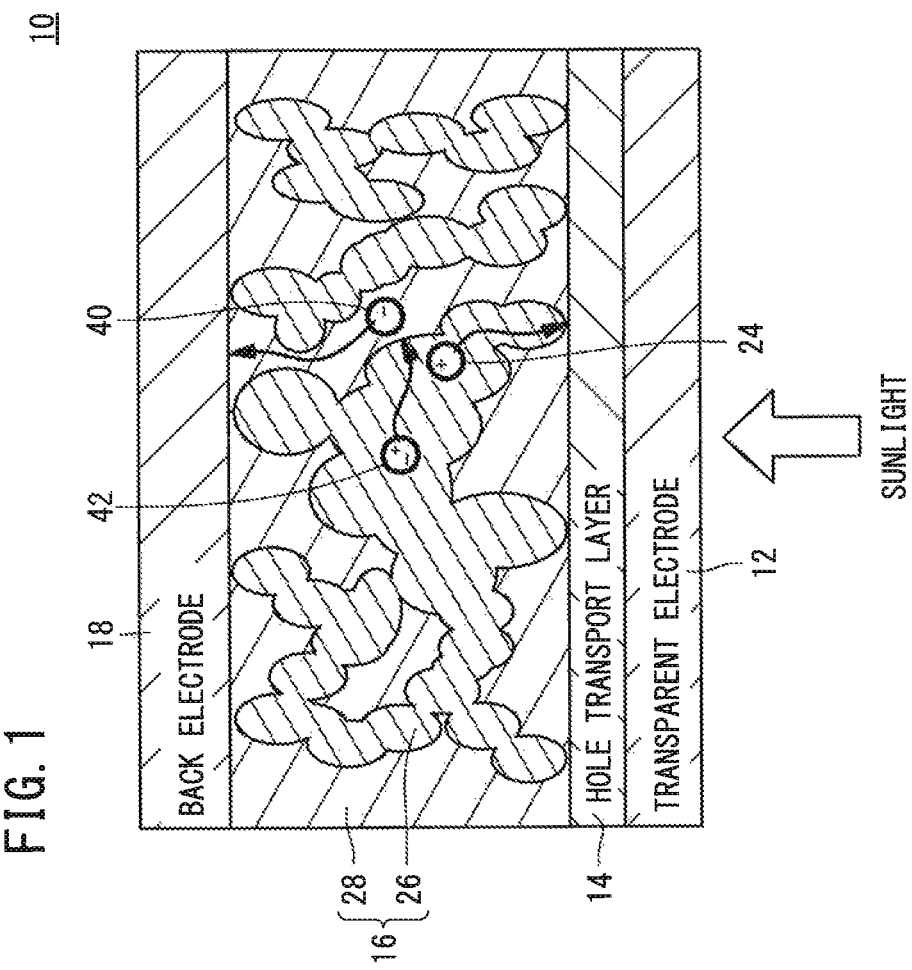
FIG. 1 is a schematic longitudinal cross-sectional view of a bulk heterojunction-type organic photovoltaic cell according to an embodiment of the present invention.

FIG. 1 is a schematic longitudinal cross-sectional view of a principal part in a BHJ solar cell 10 according to this embodiment. In the BHJ solar cell 10, a hole transport layer 14, a photoelectric conversion layer 16, and a back electrode 18 are stacked in this order on a transparent electrode 12.

The transparent electrode 12 acts as a positive electrode. Thus, holes 24 are transferred to the transparent electrode 12. The transparent electrode 12 may be composed of a material having a sufficient transmittance of a light such as sunlight, and examples of such materials include indium-tin composite oxide (ITO).

The hole transport layer 14 acts to accelerate the transfer of the holes 24 from the photoelectric conversion layer 16 to the transparent electrode 12. In general, the hole transport layer 14 contains a poly(3,4-ethylenedioxythiophene) doped with a polystyrene sulfonic acid, i.e. a so-called PEDOT:PSS.

The photoelectric conversion layer 16 contains a combination of a donor domain 26 and an acceptor domain 28. The donor domain 26 contains a photoelectric conversion material that acts as an electron donor, and the acceptor domain 28 contains a photoelectric conversion material that acts as an electron acceptor. Preferred examples of the acceptor materials include PCBM.

The donor is a p-type semiconductor composed of a photoelectric conversion material according to the embodiment of the invention. The photoelectric conversion material of this embodiment contains a polymer having a structural unit selected from graphenes represented by the following general formulae (1) to (4).

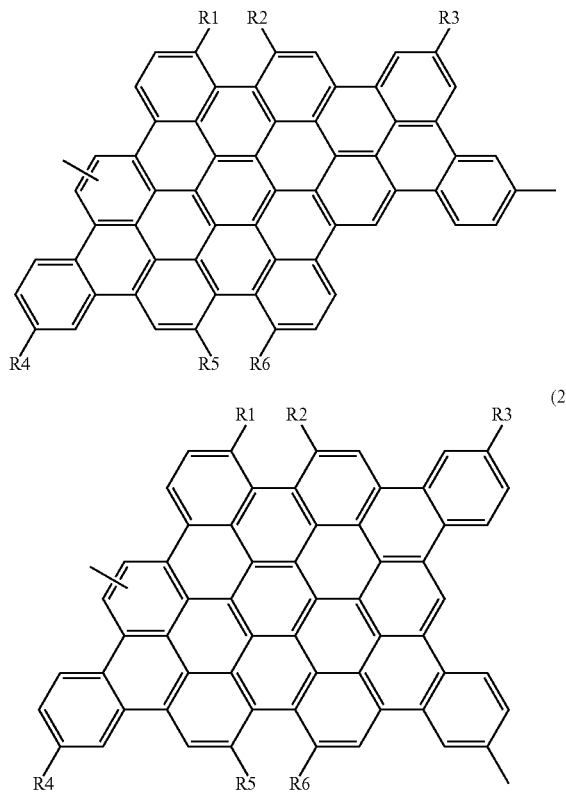

(1)

(2)

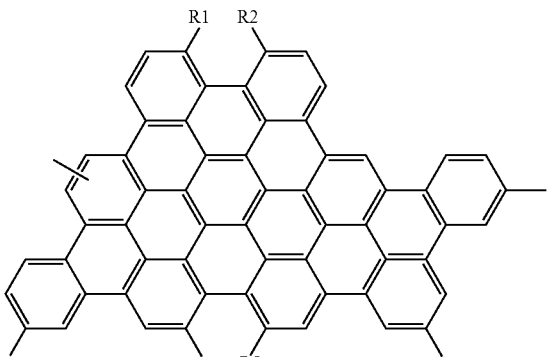

(3)

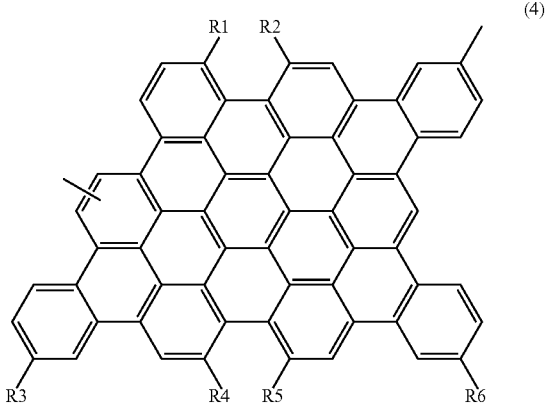

(4)

In each of the general formulae (1) to (4), at least one of R1 to R6 is a solubilizing group, and the polymer exhibits a higher solubility in an organic solvent with the solubilizing group than without the solubilizing group.

For example, the polymer may be a reaction product derived from a polyphenylene represented by the following general formula (5).

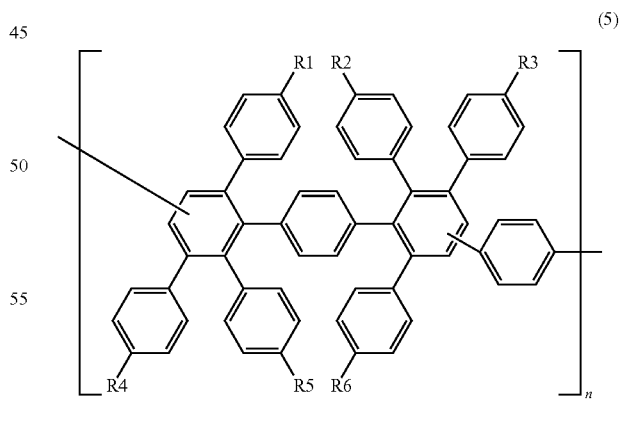

(5)

R1 to R6 in the general formula (5) have the same meanings as those in the general formulae (1) to (4).

Figure 2:
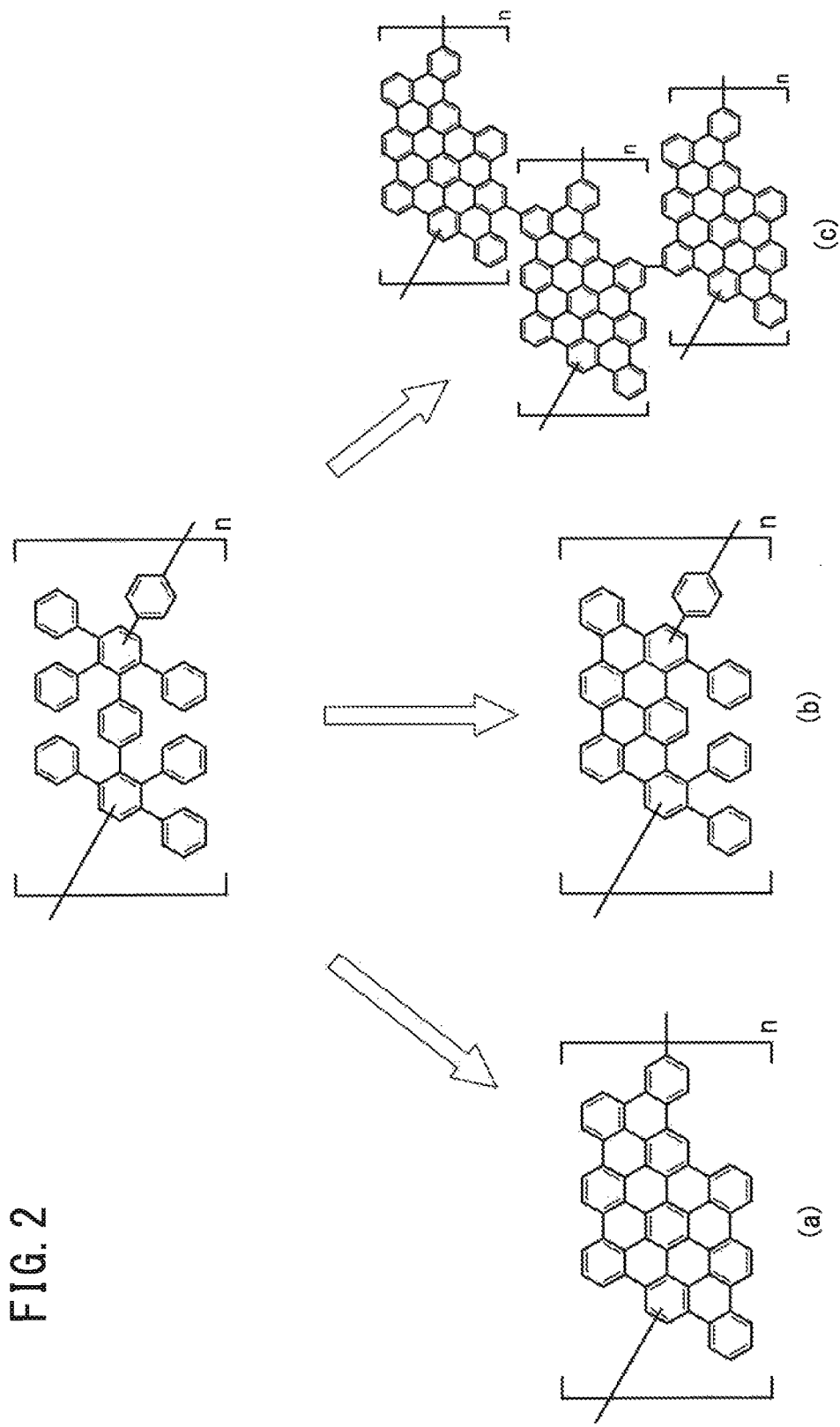
FIG. 2 is an explanatory structural view of reaction products derived from an unsubstituted polyphenylene.

In a case where an unsubstituted polyphenylene having no functional groups is reacted to produce a polymer, it is ideal that all the aromatic rings in each structural unit are reacted to form a nanographene structure shown in (a) of FIG. 2.

When the reaction of the polyphenylene does not sufficiently proceed, the resultant polymer has unreacted aromatic rings in the structural units as shown in (b) of FIG. 2. Therefore, the π-conjugated polymer often has an insufficiently spread π-electron cloud.

When the reaction of the polyphenylene proceeds excessively, the aromatic rings in each structural unit are reacted with each other, and furthermore the structural units are often cross-linked with each other as shown in (c) of FIG. 2. Thus, the resultant polymer has a cross-linked structure, and thereby may be poorly soluble or insoluble in an organic solvent or the like. Consequently, it is difficult to use a solution of the polymer for forming the photoelectric conversion layer 16.

Figure 3:
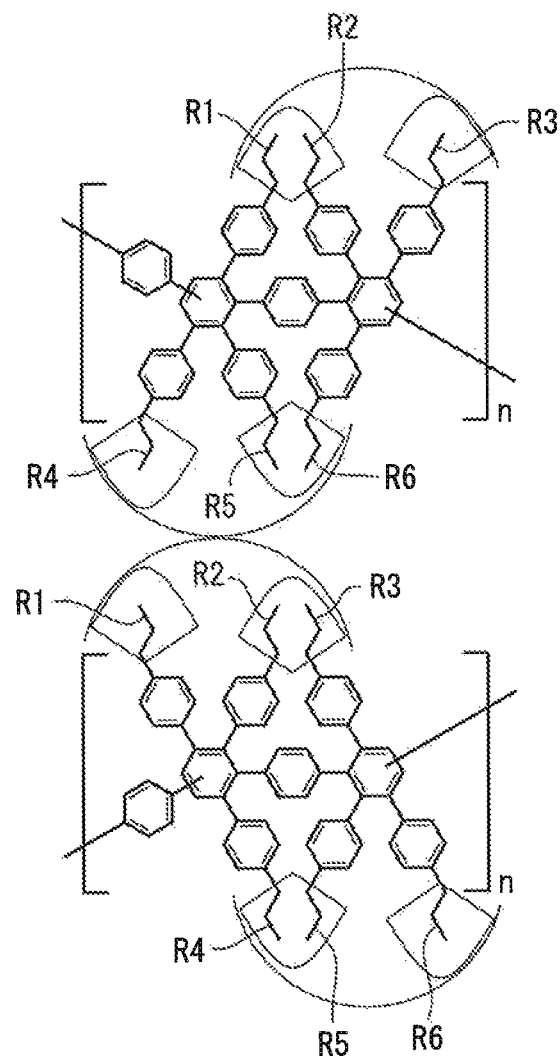
FIG. 3 is a schematic structural view for illustrating a relationship between structural units in a polyphenylene having solubilizing groups.

The polyphenylene of this embodiment has the solubilizing groups in the side chains as described above. Thus, also the polymer derived from the polyphenylene has the solubilizing groups. The solubilizing groups act as functional groups for improving the solubility of the polymer in the organic solvent. Furthermore, as shown in FIG. 3, in the reaction of the polyphenylene, the solubilizing groups act also as steric hindrances for preventing the structural units from coming close to each other. Therefore, in the polyphenylene having the solubilizing groups, the structural units can be prevented from reacting with each other, whereby the polymer can be prevented from forming the cross-linked structure. Consequently, the π-conjugated polymer with a sufficiently spread π-electron cloud can be produced. Incidentally, all of R1 to R6 shown in FIG. 3 are the solubilizing groups.

Preferred specific examples of the solubilizing groups include alkyl groups and acyl groups. The alkyl groups are particularly preferred because they can be easily bonded (introduced) to the structural unit.

The alkyl group preferably has 3 to 20 carbon atoms. When the carbon number is less than 3, it is not easy to sufficiently prevent the structural units in the polyphenylene from coming close to each other. On the other hand, when the carbon number is more than 20, the polymer has a low solubility in the solvent and is not easily formed into a layer in some cases.

In other words, when the carbon number of the alkyl group is within the above range, the polymer, which has an excellent donor property and is readily soluble in the solvent, can be efficiently produced.

Figure 4:
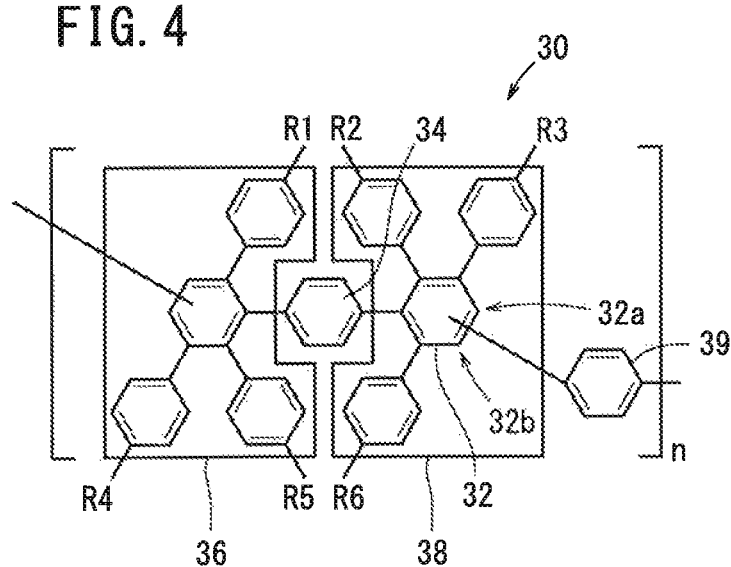
FIG. 4 is an explanatory view of the structural unit in the polyphenylene having the solubilizing groups.

The structural unit of the polyphenylene will be described below with reference to FIG. 4. As shown in FIG. 4, in a structural unit 30 of the polyphenylene, a benzene ring 39 may be bonded to any one of positions 32a and 32b in a benzene ring 32. Thus, the structural unit 30 may be selected from structural isomers.

The structural unit 30 has such a structure that triphenylbenzene skeletons 36 and 38 are singly-bonded to a center benzene ring 34. The triphenylbenzene skeletons 36 and 38 can be rotated about the single bonds to the benzene ring 34, and the conformation of the structural unit 30 can be changed depending on the rotations.

Specifically, the structural unit 30 can have the following structures U1 to U4. Consequently, the polyphenylene contains at least one of the structures.

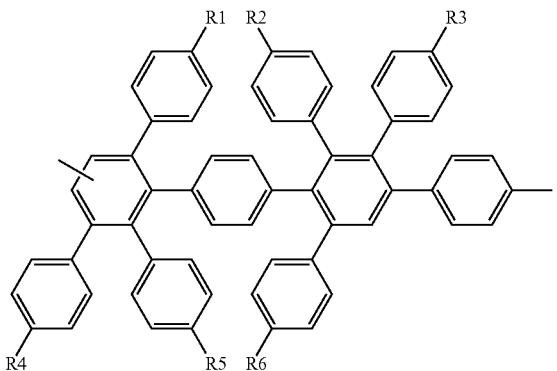

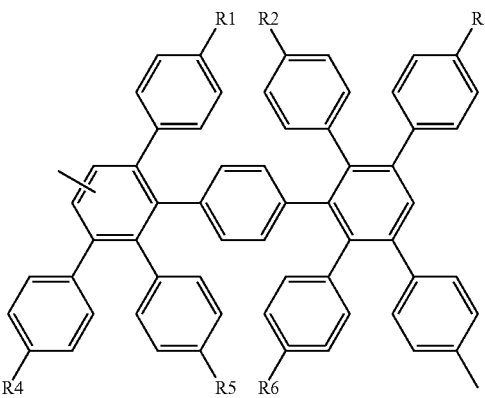

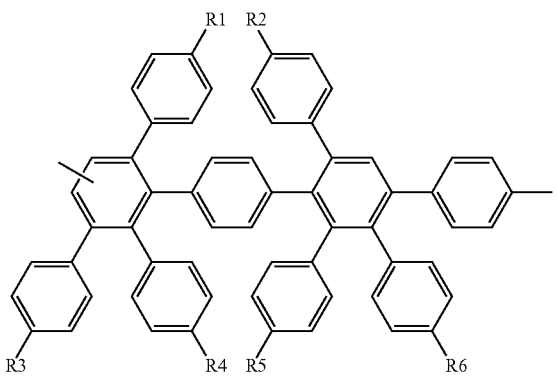

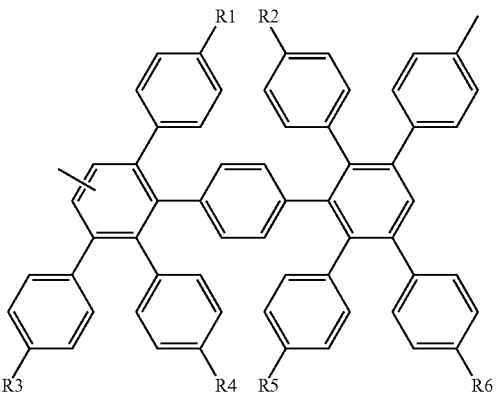

R1 to R6 in the structures U1 to U4 have the same meanings as those in the general formulae (1) to (5).

The photoelectric conversion material of this embodiment is the polymer derived from the polyphenylene having the above structure as the structural unit 30. Therefore, the structural unit (repeating unit) of the polymer depends on the structures U1 to U4 in the unreacted polyphenylene. When the structures U1 to U4 are reacted, the nanographenes represented by the following general formulae (1) to (4) are formed respectively as the structural unit of the polymer.

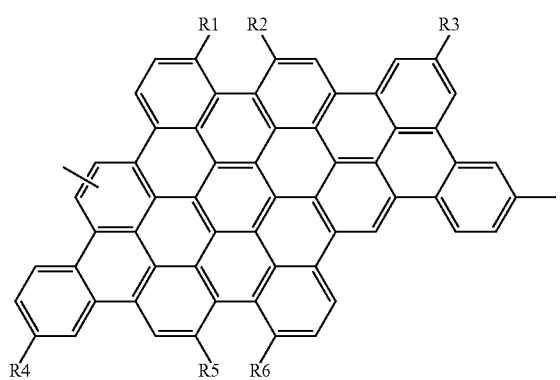

(1)

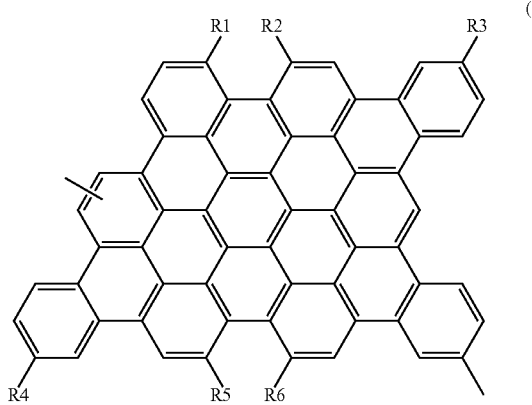

(2)

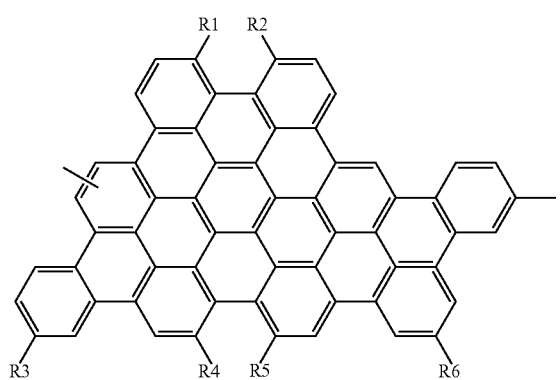

(3)

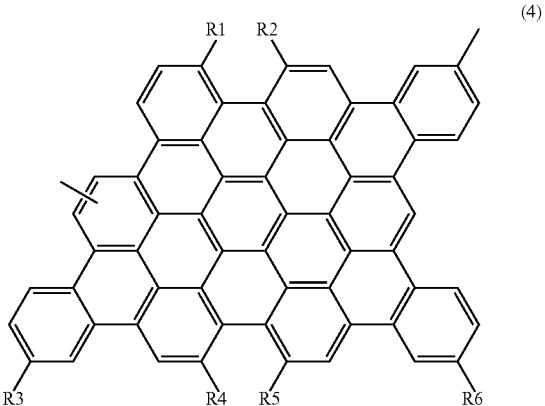

(4)

R1 to R6 in the general formulae (1) to (4) have the same meanings as above.

As described above, the photoelectric conversion material of the embodiment is the polymer having at least one structural unit selected from the nanographenes represented by the general formulae (1) to (4). The polymer may contain only one type of the nanographene represented by one of the general formulae (1) to (4), and the nanographene units may be bonded to each other, but the polymer is not limited thereto. For example, the polymer may be such that the nanographenes represented by the general formulae (1) to (4) are randomly bonded.

The polymerization degree of the polymer is preferably 10 to 150. When the polymerization degree (i.e. the number of the nanographene units bonded to each other) is less than 10, the polymer tends to have a low absorbance coefficient. On the other hand, when the polymerization degree is more than 150, it takes a long time to perform the polymerization for producing the photoelectric conversion material, resulting in a low production efficiency.

In other words, when the polymerization degree is within the above range, the photoelectric conversion material can be efficiently produced with a sufficiently improved absorbance coefficient.

The nanographenes represented by the general formulae (1) to (4) have a molecular weight of 911 to 2426. Thus, when the polymer has a polymerization degree of 10 to 150, the polymer has a molecular weight of 9,900 to 364,000.

In the BHJ solar cell 10 (see FIG. 1), the back electrode 18 is stacked on the photoelectric conversion layer 16 containing the photoelectric conversion material of the polymer. The back electrode 18 acts as a negative electrode, to which electrons 40 are transferred.

The BHJ solar cell 10 of the embodiment has the above-described basic structure. Operations and advantageous effects of the BHJ solar cell 10 will be described below.

When a light (such as sunlight) is injected to the transparent electrode 12 of the BHJ solar cell 10, the light is transferred through the hole transport layer 14 to the photoelectric conversion layer 16. Then, excitons 42 are generated in the photoelectric conversion layer 16.

The generated excitons 42 are moved in the donor domain 26, and reach the interface between the donor domain 26 and the acceptor domain 28. The excitons 42 are divided into the electrons 40 and the holes 24 on the interface. As described above, the electrons 40 are moved in the acceptor domain 28, and reach the back electrode 18 used as the negative electrode. On the other hand, the holes 24 are moved in the donor domain 26, are transferred through the hole transport layer 14, and reach the transparent electrode 12 used as the positive electrode.

In this embodiment, the donor domain 26 in the photoelectric conversion layer 16 contains the polymer having at least one structural unit selected from the nanographenes represented by the general structural formulae (1) to (4).

As is clear from the general formulae (1) to (4), the π-electron cloud spreads over the entire nanographene. Thus, the polymer used in the donor domain 26 is a π-conjugated polymer. Naturally the π-electron cloud spreads over a wider area in the polymer than in the single nanographene unit (monomer).

The polymer, which has such a sufficiently spread π-electron cloud, exhibits a maximum absorption wavelength shifted to the long-wavelength side and has a high absorbance coefficient. Thus, the polymer exhibits a narrow bandgap (Eg) corresponding to a small energy level difference between the HOMO and LUMO. Consequently, the excitons 42 are actively generated in the donor domain 26, resulting in a high sunlight utilization efficiency.

In this case, as described hereinafter, the donor polymer has a LUMO energy level of about −3.5 eV, which is deeper than that of P3HT (about −2.5 eV). Thus, the LUMO energy level of the polymer is closer to that of PCBM (the fullerene derivative) in the acceptor domain 28.

This is likely because the nanographene structural unit in the polymer is a condensed aromatic ring having an aromatic hydrocarbon skeleton, which is similar to the structure of PCBM. Consequently, the BHJ solar cell 10 exhibits a high open circuit voltage Voc.

The BHJ solar cell 10 exhibits an excellent photoelectric power conversion efficiency because of the above properties. Therefore, only a smaller area of the BHJ solar cell 10 is required for achieving a desired power generation capacity. Consequently, the BHJ solar cell 10 can have a light weight and a small load on its installation site, so that the layout of the BHJ solar cell 10 can be designed more freely.

A photoelectric conversion material production method according to this embodiment will be described below in relation to the production of the polymer.

As described above, the polymer can be obtained as the reaction product derived from the polyphenylene having the solubilizing group. An example, which contains preparing the polyphenylene having the structure U1 and introducing an alkyl group as the solubilizing group into the polyphenylene, will be described hereinafter.

For example, an unsubstituted polyphenylene can be prepared by reacting a biscyclopentadienone with a diacetylene as shown in the following reaction formula (6).

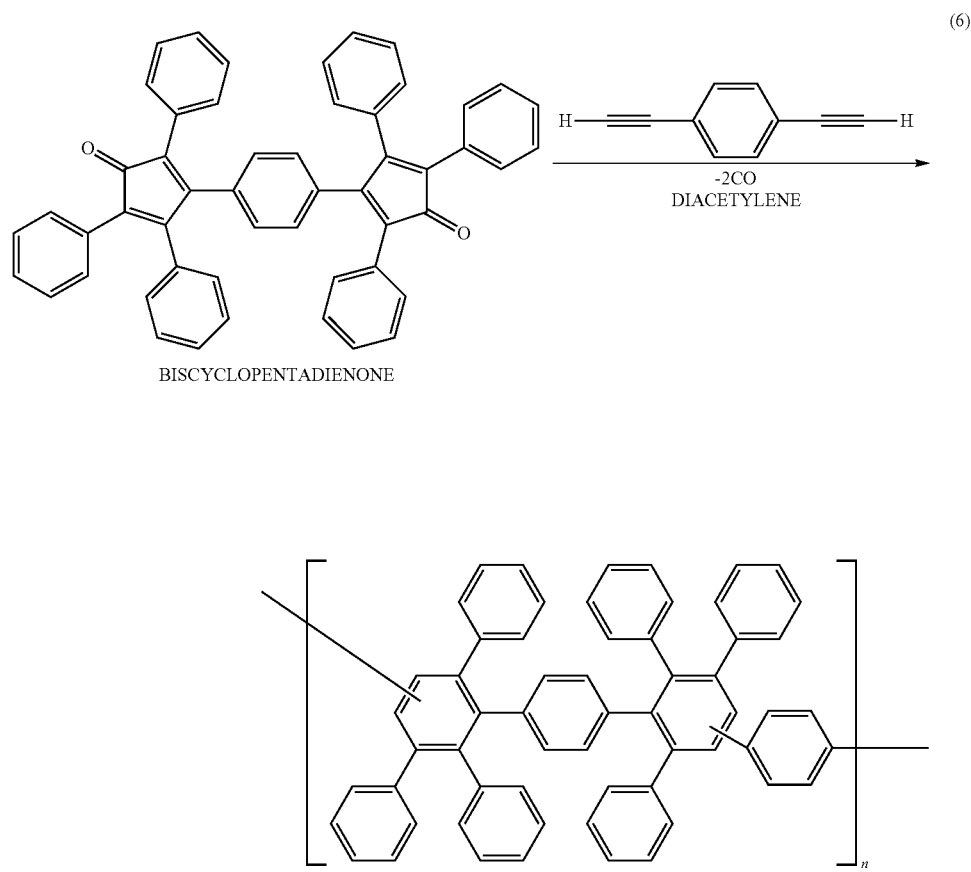

(6)

The biscyclopentadienone can be produced by a known method. For example, 1,4-bisbenzil and dibenzyl ketone (1,3-diphenyl-2-propanone) are mixed with n-butanol to prepare a mixture solution, and a methanol solution of Triton B (benzyltrimethylammonium hydroxide) is added to the solution under heating.

An acyl group is introduced to the side-chain phenyl group of the obtained unsubstituted polyphenylene. Specifically, for example, the unsubstituted polyphenylene is acylated using an acylating agent of a carboxylic acid chloride and a catalyst of aluminum chloride ($AlCl_3$) as shown in the following reaction formula (7).

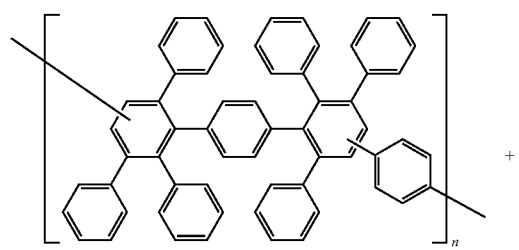

(7)

+

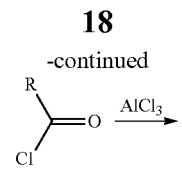

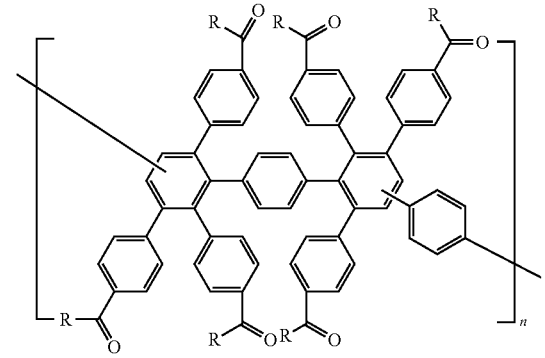

In the formula (7), R represents an alkyl group.

Then, for example, the acylated polyphenylene is reduced with reducing agents of lithium aluminum hydride ($LiAlH_4$) and aluminum chloride as shown in the following reaction formula (8), to produce the alkyl-substituted polyphenylene.

(8)

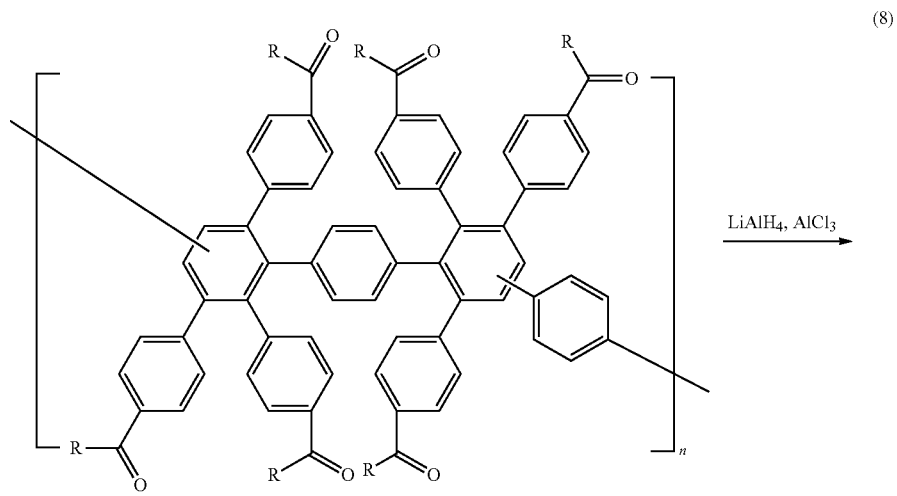

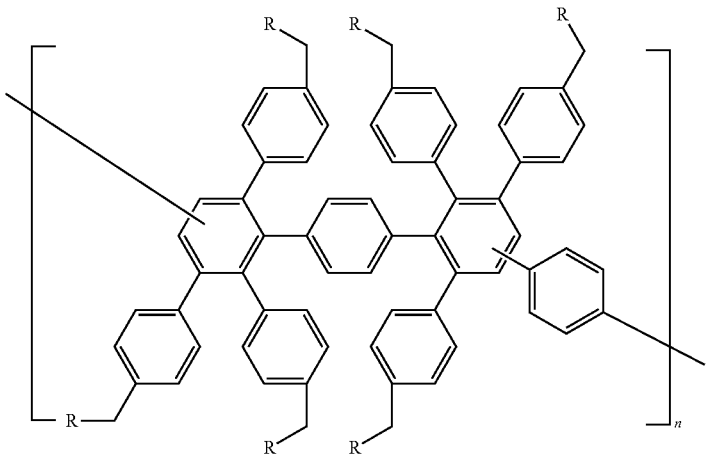

In the formula (8), R represents the alkyl group.

Figure 5:
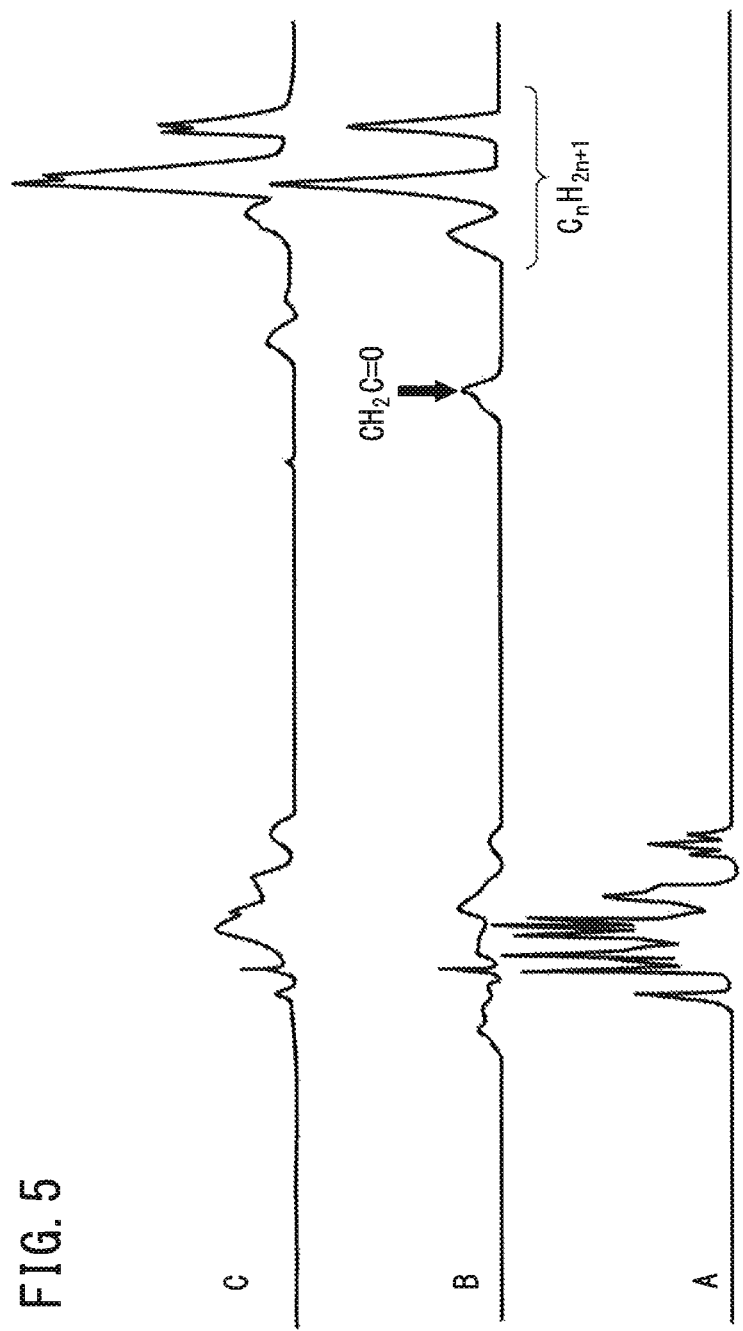
FIG. 5 is a diagram including $^1$H-nuclear magnetic resonance (NMR) spectra of an unsubstituted polyphenylene, an acylated polyphenylene, and an alkyl-substituted polyphenylene.
Figure 6:
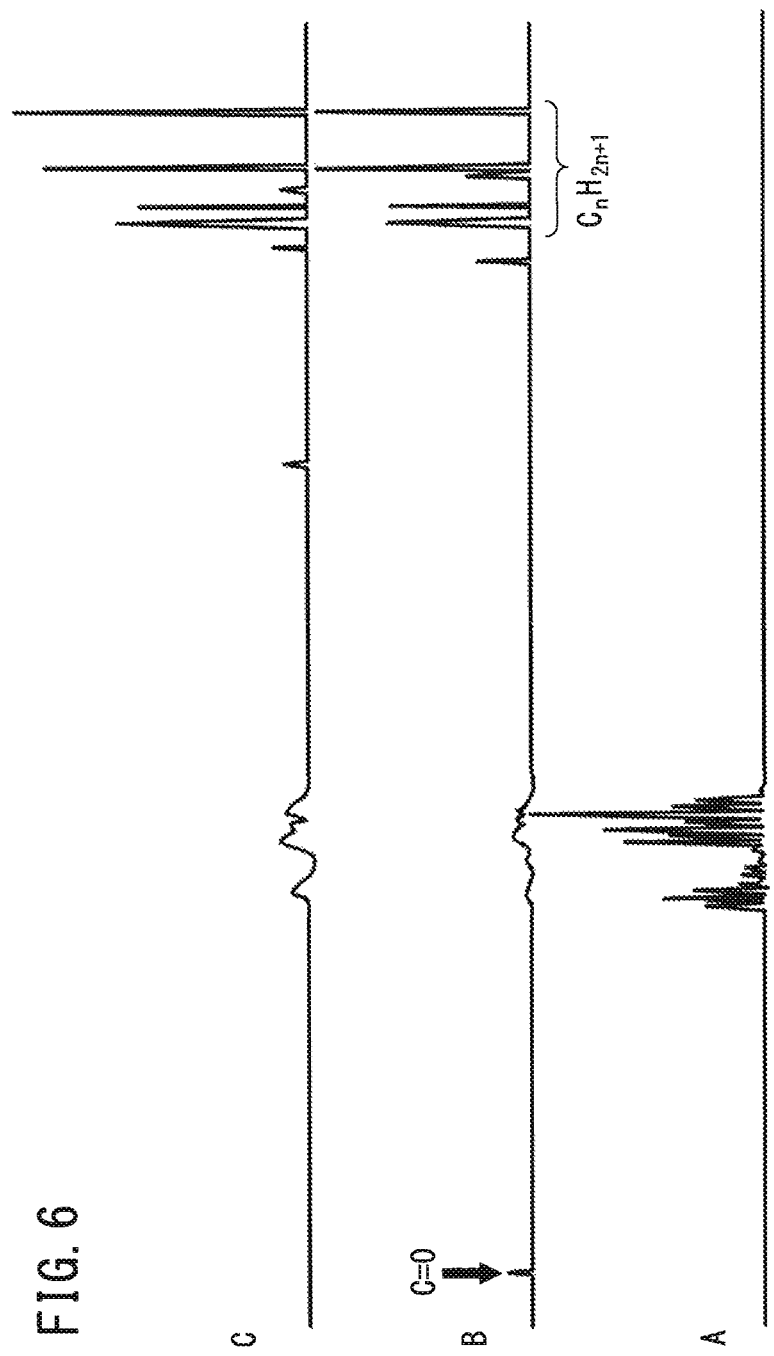
FIG. 6 is a diagram including $^{13}$C-NMR spectra of the unsubstituted polyphenylene, the acylated polyphenylene, and the alkyl-substituted polyphenylene.

FIG. 5 is a diagram including $^1$H-nuclear magnetic resonance (NMR) spectra of the unsubstituted polyphenylene, the acylated polyphenylene, and the alkyl-substituted polyphenylene having heptyl groups ($C_7H_{15}$), and FIG. 6 is a diagram including $^{13}$C-NMR spectra of the polyphenylenes. In FIGS. 5 and 6, A indicates the spectrum of the unsubstituted polyphenylene, B indicates the spectrum of the acylated polyphenylene, and C indicates the spectrum of alkyl-substituted polyphenylene.

As shown in FIGS. 5 and 6, peaks of $CH_2C=O$ and $C_nH_{2n+1}$ are not observed in the spectra of A, and are observed in the spectra of B. Furthermore, a peak of $C=O$ appears in the spectra of B, while the peak is not observed in the spectra of A. Thus, it is clear that the acyl group is introduced into the unsubstituted polyphenylene by the above acylation.

As shown in FIGS. 5 and 6, the peaks of $C_nH_{2n+1}$ are observed in the spectra of C though the peaks are not observed in the spectra of A. Furthermore, the peaks of $CH_2C=O$ and $C=O$, which are observed in the spectra of B, disappears in the spectra of C. Thus, it is clear that the alkyl group ($C_nH_{2n+1}$) is formed in the polyphenylene by reducing the above acylated polyphenylene.

Then, for example, the alkyl-substituted polyphenylene is subjected to a reaction using a catalyst of iron chloride ($FeCl_3$) as shown in the following reaction formula (9), to produce the polymer having the nanographene structural unit.

In the formula (9), R represents the alkyl group.

As described above, the alkyl groups act as steric hindrances for preventing the reaction between the structural units in the polyphenylene.

In another example using the polyphenylene having one of the structures U2 to U4, the polymer having the nanographene structural unit represented by one of the general formulae (2) to (4) is produced as shown in the following reaction formulae (10) to (12).

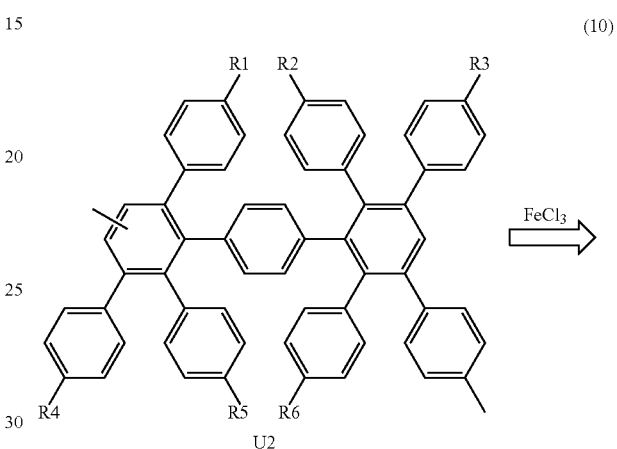

(10)

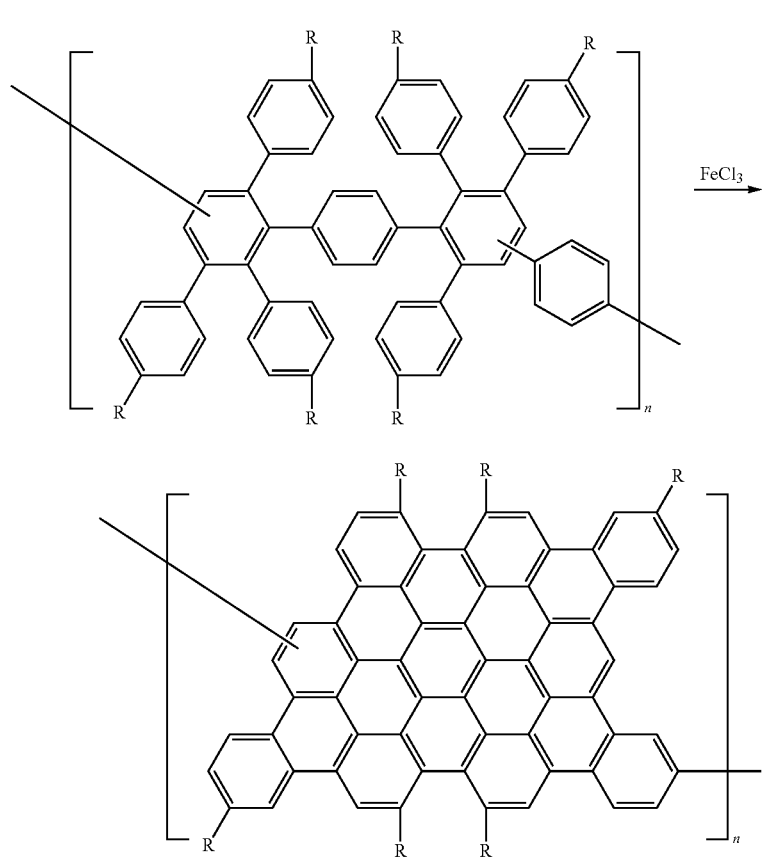

(9)

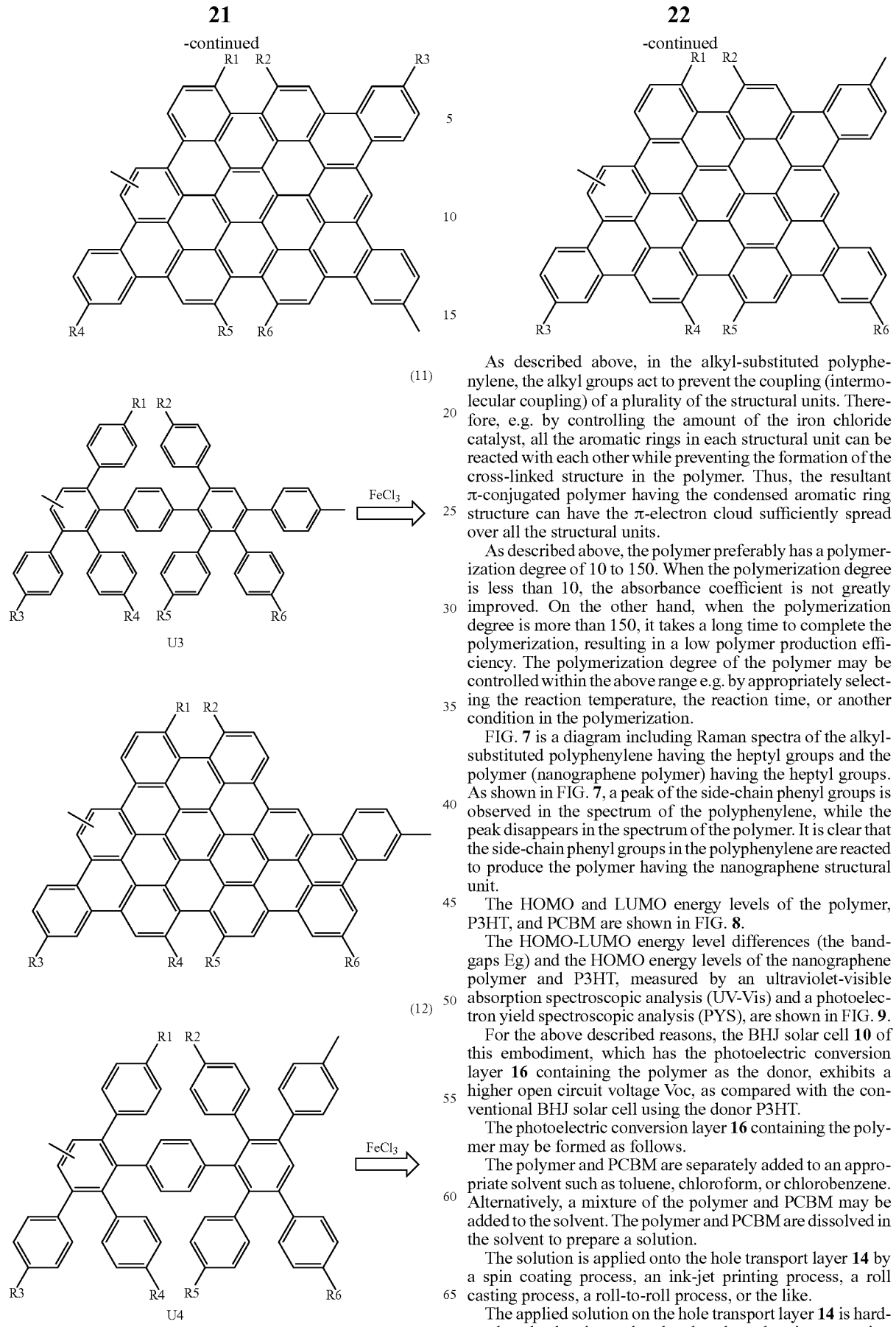

As described above, in the alkyl-substituted polyphenylene, the alkyl groups act to prevent the coupling (intermolecular coupling) of a plurality of the structural units. Therefore, e.g. by controlling the amount of the iron chloride catalyst, all the aromatic rings in each structural unit can be reacted with each other while preventing the formation of the cross-linked structure in the polymer. Thus, the resultant π-conjugated polymer having the condensed aromatic ring structure can have the π-electron cloud sufficiently spread over all the structural units.

As described above, the polymer preferably has a polymerization degree of 10 to 150. When the polymerization degree is less than 10, the absorbance coefficient is not greatly improved. On the other hand, when the polymerization degree is more than 150, it takes a long time to complete the polymerization, resulting in a low polymer production efficiency. The polymerization degree of the polymer may be controlled within the above range e.g. by appropriately selecting the reaction temperature, the reaction time, or another condition in the polymerization.

Figure 7:
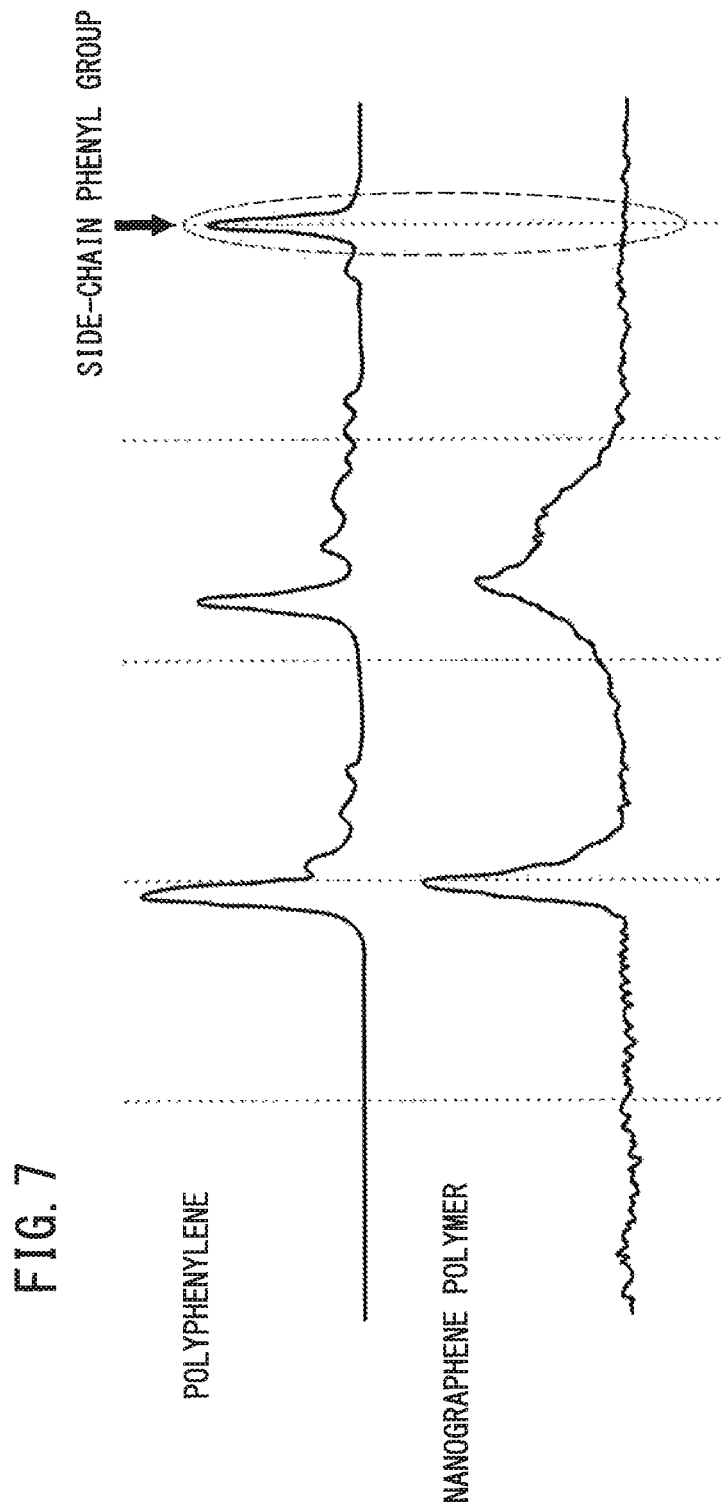
FIG. 7 is a diagram including Raman spectra of the alkyl-substituted polyphenylene and a photoelectric conversion material (nanographene polymer) according to the embodiment.

FIG. 7 is a diagram including Raman spectra of the alkyl-substituted polyphenylene having the heptyl groups and the polymer (nanographene polymer) having the heptyl groups. As shown in FIG. 7, a peak of the side-chain phenyl groups is observed in the spectrum of the polyphenylene, while the peak disappears in the spectrum of the polymer. It is clear that the side-chain phenyl groups in the polyphenylene are reacted to produce the polymer having the nanographene structural unit.

Figure 8:
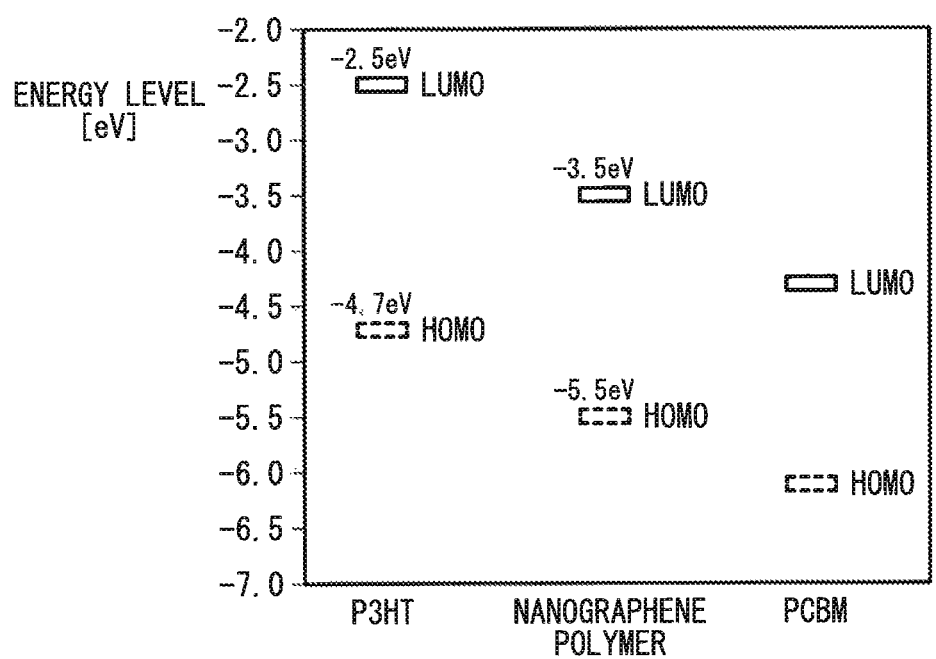
FIG. 8 is an energy level diagram including the HOMO and LUMO energy levels of the photoelectric conversion material, P3HT, and PCBM.
Figure 10:
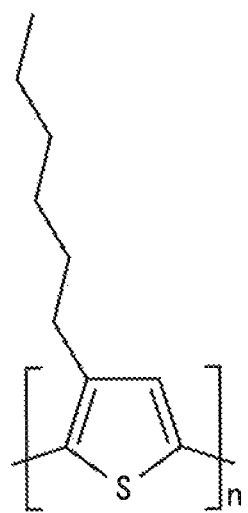
FIG. 10 is a structural formula of P3HT.
Figure 11:
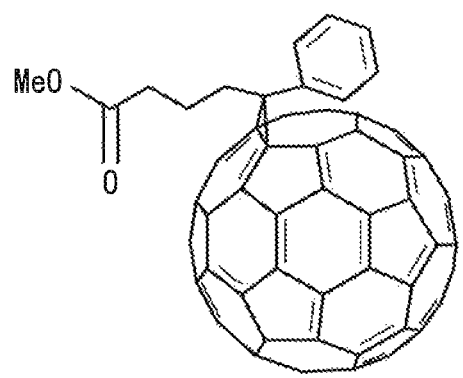
FIG. 11 is a structural formula of PCBM.
Figure 12:
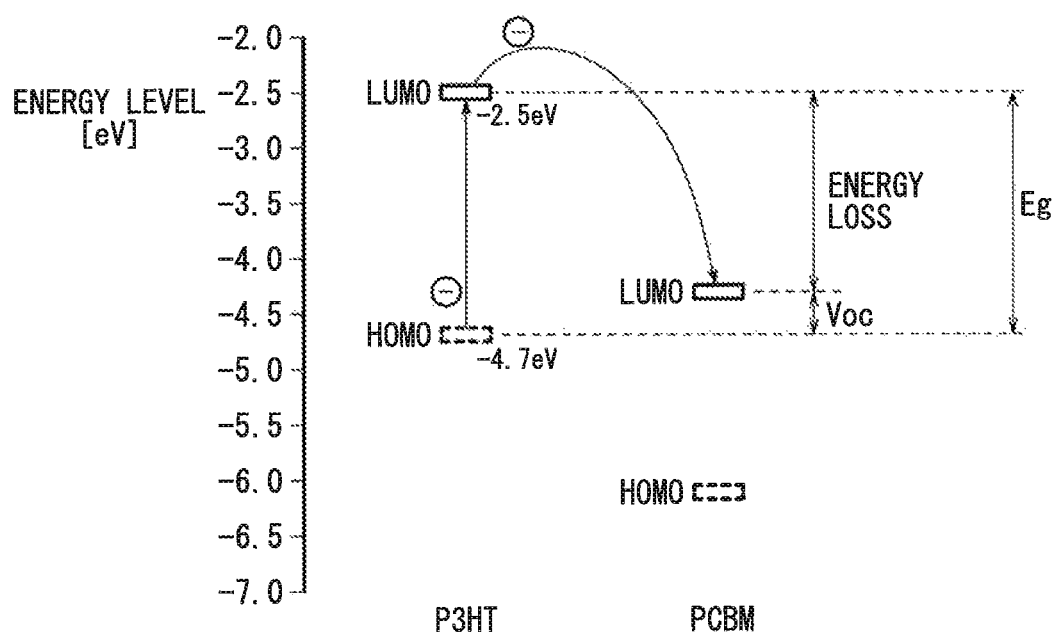
FIG. 12 is a schematic explanatory view of electron transition from the HOMO of P3HT through the LUMO of P3HT to the LUMO of PCBM.

The HOMO and LUMO energy levels of the polymer, P3HT, and PCBM are shown in FIG. 8.

The HOMO-LUMO energy level differences (the bandgaps Eg) and the HOMO energy levels of the nanographene polymer and P3HT, measured by an ultraviolet-visible absorption spectroscopic analysis (UV-Vis) and a photoelectron yield spectroscopic analysis (PYS), are shown in FIG. 9.

For the above described reasons, the BHJ solar cell 10 of this embodiment, which has the photoelectric conversion layer 16 containing the polymer as the donor, exhibits a higher open circuit voltage Voc, as compared with the conventional BHJ solar cell using the donor P3HT.

The photoelectric conversion layer 16 containing the polymer may be formed as follows.

The polymer and PCBM are separately added to an appropriate solvent such as toluene, chloroform, or chlorobenzene. Alternatively, a mixture of the polymer and PCBM may be added to the solvent. The polymer and PCBM are dissolved in the solvent to prepare a solution.

The solution is applied onto the hole transport layer 14 by a spin coating process, an ink-jet printing process, a roll casting process, a roll-to-roll process, or the like.

The applied solution on the hole transport layer 14 is hardened under heating, whereby the photoelectric conversion layer 16 is formed. The photoelectric conversion layer 16 may be subjected to an annealing treatment if necessary. In the annealing treatment, the phase separation between the donor domain 26 and the acceptor domain 28 can be further improved, and the joint interface area between the donor domain 26 and the acceptor domain 28 can be increased to improve the function.

In a case where a monomer is used as the donor, it is difficult to use the above process for forming the photoelectric conversion layer 16 because of the low solubility of the monomer in the solvent. In contrast, in this embodiment, the polymer having the solubilizing group is used as the donor as described above. Since the polymer is readily soluble in the solvent, the photoelectric conversion layer 16 containing the polymer can be simply formed with ease at low cost by the above process.

It is to be understood that the present invention is not limited to the above embodiment, and various changes and modifications may be made therein without departing from the scope of the invention.

For example, the above embodiment is described with relation to the bulk heterojunction-type organic photovoltaic cells (BHJ solar cell) 10 having the photoelectric conversion layer 16 containing the mixture of the donor and the acceptor. The present invention is not particularly limited thereto, and the polymer may be used in a planar heterojunction-type organic photovoltaic cell having a donor layer and an acceptor layer separated from each other. In this case, the polymer may be contained in the donor layer.

In the above embodiment, the polymer (photoelectric conversion material) is used as the donor in the organic photovoltaic cells. The present invention is not particularly limited thereto, and the polymer may be used as the acceptor in the organic photovoltaic cells.

Furthermore, the use of the polymer (photoelectric conversion material) is not limited to the photoelectric conversion layer 16 in the organic photovoltaic cells. For example, the polymer may be used in an optical sensor.

What is claimed is:

1. A photoelectric conversion material that acts as an electron donor for donating an electron or an electron acceptor for accepting an electron, comprising
   a polymer having at least one structural unit selected from graphenes represented by the following general formulae (1) to (4):

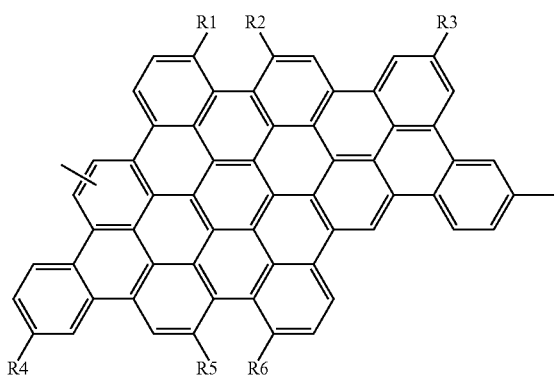

(1)

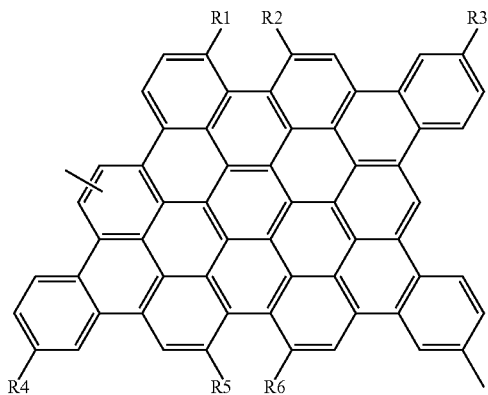

(2)

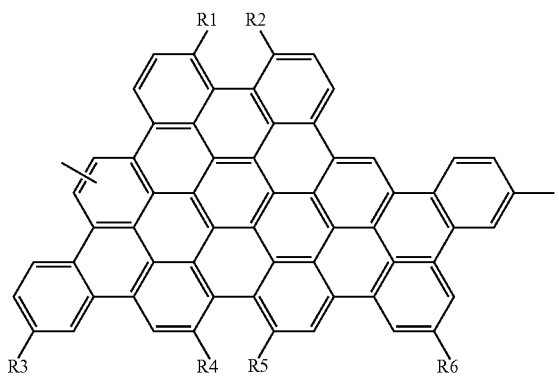

(3)

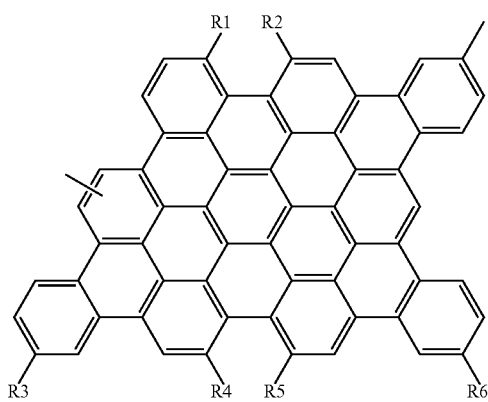

(4)

wherein at least one of R1 to R6 in each of the general formulae (1) to (4) is an alkyl or acyl group.

2. The photoelectric conversion material according to claim 1, wherein the polymer is a reaction product derived from a polyphenylene represented by the following general formula (5):

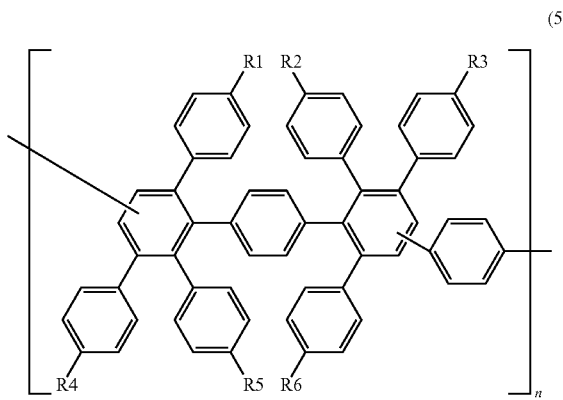

(5)

wherein at least one of R1 to R6 in the general formula (5) is an alkyl or acyl group.

3. The photoelectric conversion material according to claim 1, wherein R1 to R6 in the general formulae (1) to (4) are each selected from alkyl groups.

4. The photoelectric conversion material according to claim 3, wherein R1 to R6 in the general formulae (1) to (4) are each selected from alkyl groups having 3 to 20 carbon atoms.

5. The photoelectric conversion material according to claim 1, wherein the polymer has a polymerization degree of 10 to 150.

6. The photoelectric conversion material according to claim 5, wherein the polymer has a molecular weight of 9,900 to 364,000.

7. A method for producing a photoelectric conversion material that acts as an electron donor for donating an electron or an electron acceptor for accepting an electron, comprising polymerizing a phenylene derivative to prepare a polyphenylene represented by the following general formula (5):

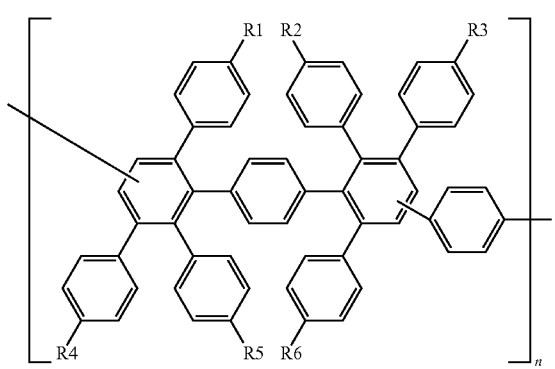

(5)

and reacting the polyphenylene to prepare a polymer having at least one structural unit selected from graphenes represented by the following general formulae (1) to (4):

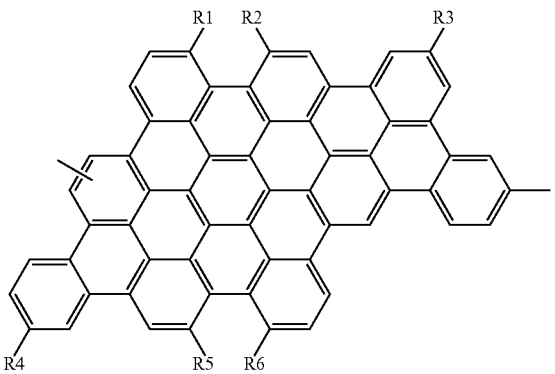

(1)

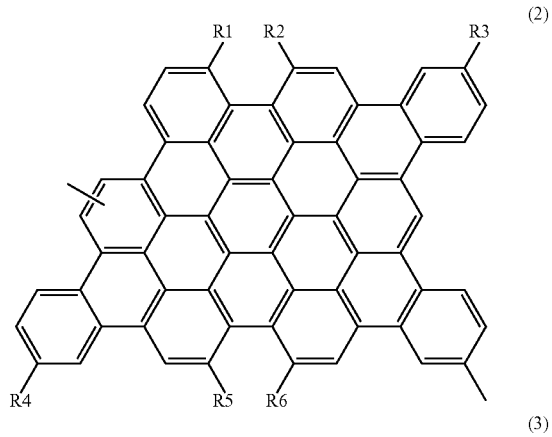

(2)

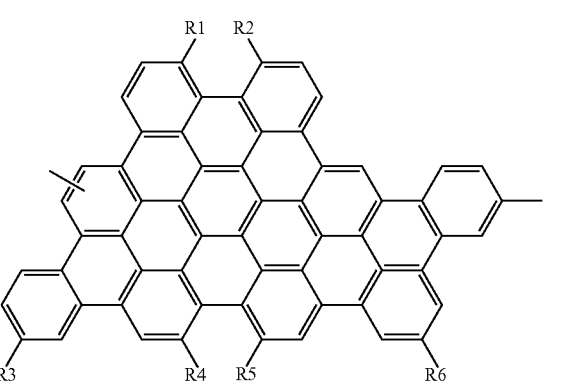

(3)

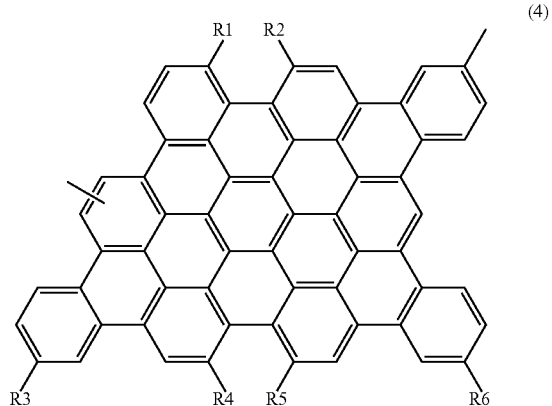

(4)

wherein at least one of R1 to R6 in each of the general formulae (1) to (5) is an alkyl or acyl group.

8. The method according to claim 7, wherein R1 to R6 in the general formulae (1) to (5) are each selected from alkyl groups.

9. The method according to claim 8, wherein R1 to R6 in the general formulae (1) to (5) are each selected from alkyl groups having 3 to 20 carbon atoms.

10. The method according to claim 7, wherein the polymer has a polymerization degree of 10 to 150.

11. The method according to claim 10, wherein the polymer has a molecular weight of 9,900 to 364,000.

12. An organic photovoltaic cell comprising a photoelectric conversion material that acts as an electron donor for donating an electron or an electron acceptor for accepting an electron, wherein
the organic photovoltaic cell has a photoelectric conversion layer, and
the photoelectric conversion layer contains, as an electron donor, a photoelectric conversion material containing a polymer having at least one structural unit selected from graphenes represented by the following general formulae (1) to (4):

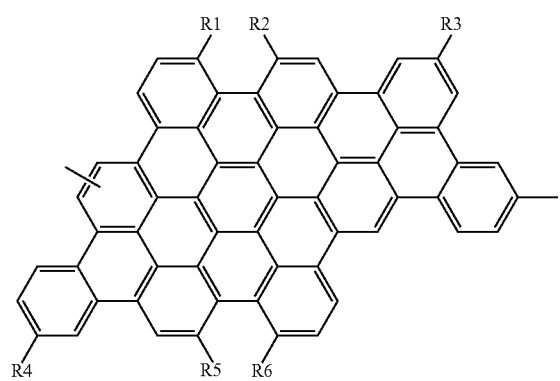
(1)

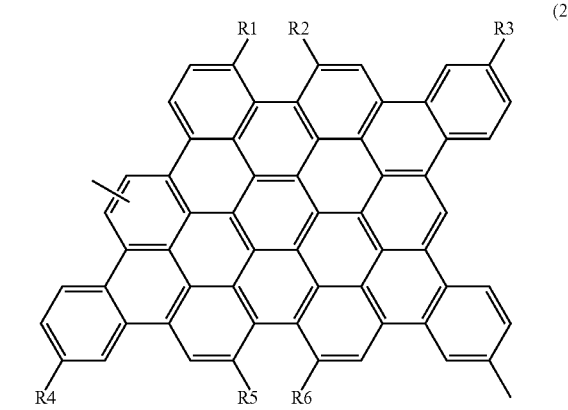
(2)

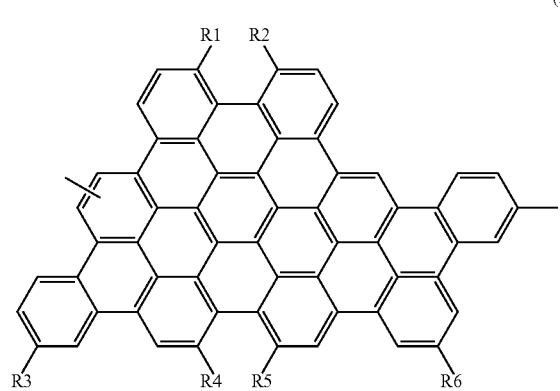
(3)

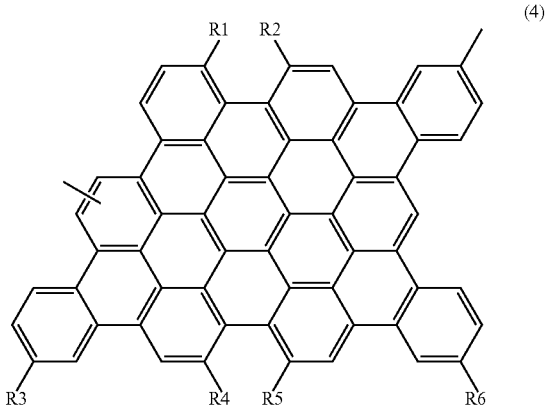
(4)

wherein at least one of R1 to R6 in each of the general formulae (1) to (4) is an alkyl or acyl group.

13. The organic photovoltaic cell according to claim 12, wherein the polymer is a reaction product derived from a polyphenylene represented by the following general formula (5):

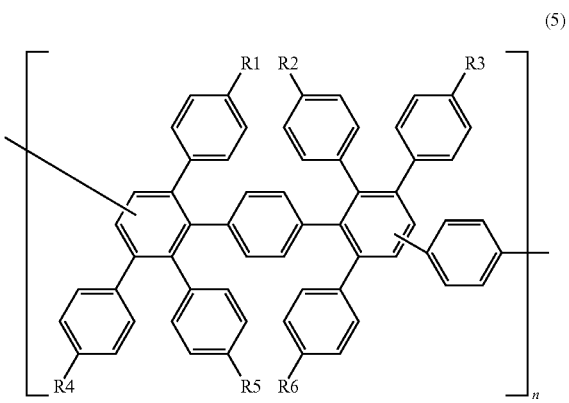
(5)

wherein at least one of R1 to R6 in the general formula (5) is an alkyl or acyl group.

14. The organic photovoltaic cell according to claim 12, wherein R1 to R6 in the general formulae (1) to (4) are each selected from alkyl groups.

15. The organic photovoltaic cell according to claim 14, wherein R1 to R6 in the general formulae (1) to (4) are each selected from alkyl groups having 3 to 20 carbon atoms.

16. The organic photovoltaic cell according to claim 12, wherein the polymer has a polymerization degree of 10 to 150.

17. The organic photovoltaic cell according to claim 16, wherein the polymer has a molecular weight of 9,900 to 364,000.

18. The organic photovoltaic cell according to claim 12, having a bulk heterojunction structure containing the photoelectric conversion layer, wherein
the photoelectric conversion layer contains a mixture of the electron donor and an electron acceptor for accepting an electron released from the electron donor.

* * * * *